US012573460B2

(12) United States Patent
Isobe et al.

(10) Patent No.: US 12,573,460 B2
(45) Date of Patent: Mar. 10, 2026

(54) SEMICONDUCTOR MEMORY DEVICE

(71) Applicant: Kioxia Corporation, Tokyo (JP)

(72) Inventors: Katsuaki Isobe, Yokohama Kanagawa (JP); Takeshi Hioka, Tokyo (JP); Mario Sako, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 163 days.

(21) Appl. No.: 18/332,753

(22) Filed: Jun. 12, 2023

(65) Prior Publication Data

US 2024/0087656 A1 Mar. 14, 2024

(30) Foreign Application Priority Data

Sep. 8, 2022 (JP) ................................. 2022-143205

(51) Int. Cl.
*G11C 16/04* (2006.01)
*G11C 16/26* (2006.01)

(52) U.S. Cl.
CPC .......... *G11C 16/26* (2013.01); *G11C 16/0483* (2013.01)

(58) Field of Classification Search
CPC ............................ G11C 16/26; G11C 16/0483
See application file for complete search history.

(56) References Cited

U.S. PATENT DOCUMENTS

| | | | | |
|---|---|---|---|---|
| 7,016,245 | B2 * | 3/2006 | Balasubramanian .. | G11C 7/227 365/207 |
| 9,171,631 | B2 | 10/2015 | Kamata et al. | |

| | | | | |
|---|---|---|---|---|
| 10,121,522 | B1 | 11/2018 | Tseng et al. | |
| 10,176,871 | B2 | 1/2019 | Missiroli et al. | |
| 10,395,741 | B2 | 8/2019 | Park et al. | |
| 11,127,470 | B2 | 9/2021 | Sako | |
| 11,501,825 | B2 | 11/2022 | Sako | |
| 11,887,690 | B2 * | 1/2024 | Vimercati ............. | G11C 11/221 |
| 2009/0244978 | A1 | 10/2009 | Yoshihara et al. | |
| 2010/0039864 | A1 * | 2/2010 | Sarin ................... | G11C 16/344 365/230.03 |

(Continued)

FOREIGN PATENT DOCUMENTS

| | | | |
|---|---|---|---|
| JP | 4635068 | B2 | 11/2010 |
| JP | 2013004629 | A | 1/2013 |

(Continued)

OTHER PUBLICATIONS

U.S. Appl. No. 18/203,952, First Named Inventor: Hiroshi Maejima; Title: "Semiconductor Memory Device"; filed May 31, 2023.

*Primary Examiner* — Pho M Luu
(74) *Attorney, Agent, or Firm* — Holtz, Holtz & Volek PC

(57) ABSTRACT

A semiconductor memory device includes a first memory cell transistor, a first bit line electrically coupled to the first memory cell transistor, a first sense amplifier, and a first latch circuit. The first sense amplifier includes a first node coupled to the first bit line, a first transistor including one end electrically coupled to the first latch circuit, a second node coupled to a gate of the first transistor, and a second transistor coupled between the first and second nodes. The second transistor is in an ON state during an operation of transferring a charge from the first bit line to the first and second nodes in accordance with data of the first memory cell transistor. The second transistor is in an OFF state during an operation of transferring data of the second node to the first latch circuit.

15 Claims, 15 Drawing Sheets

(56)            References Cited

U.S. PATENT DOCUMENTS

| | | |
|---|---|---|
| 2012/0320651 A1 | 12/2012 | Kono |
| 2017/0263325 A1 | 9/2017 | Kamata et al. |
| 2017/0365348 A1 | 12/2017 | Kamata et al. |
| 2020/0335513 A1 | 10/2020 | Morozumi et al. |
| 2021/0118862 A1 | 4/2021 | Maejima et al. |

FOREIGN PATENT DOCUMENTS

| | | |
|---|---|---|
| JP | 2017224374 A | 12/2017 |
| JP | 2020178010 A | 10/2020 |

* cited by examiner

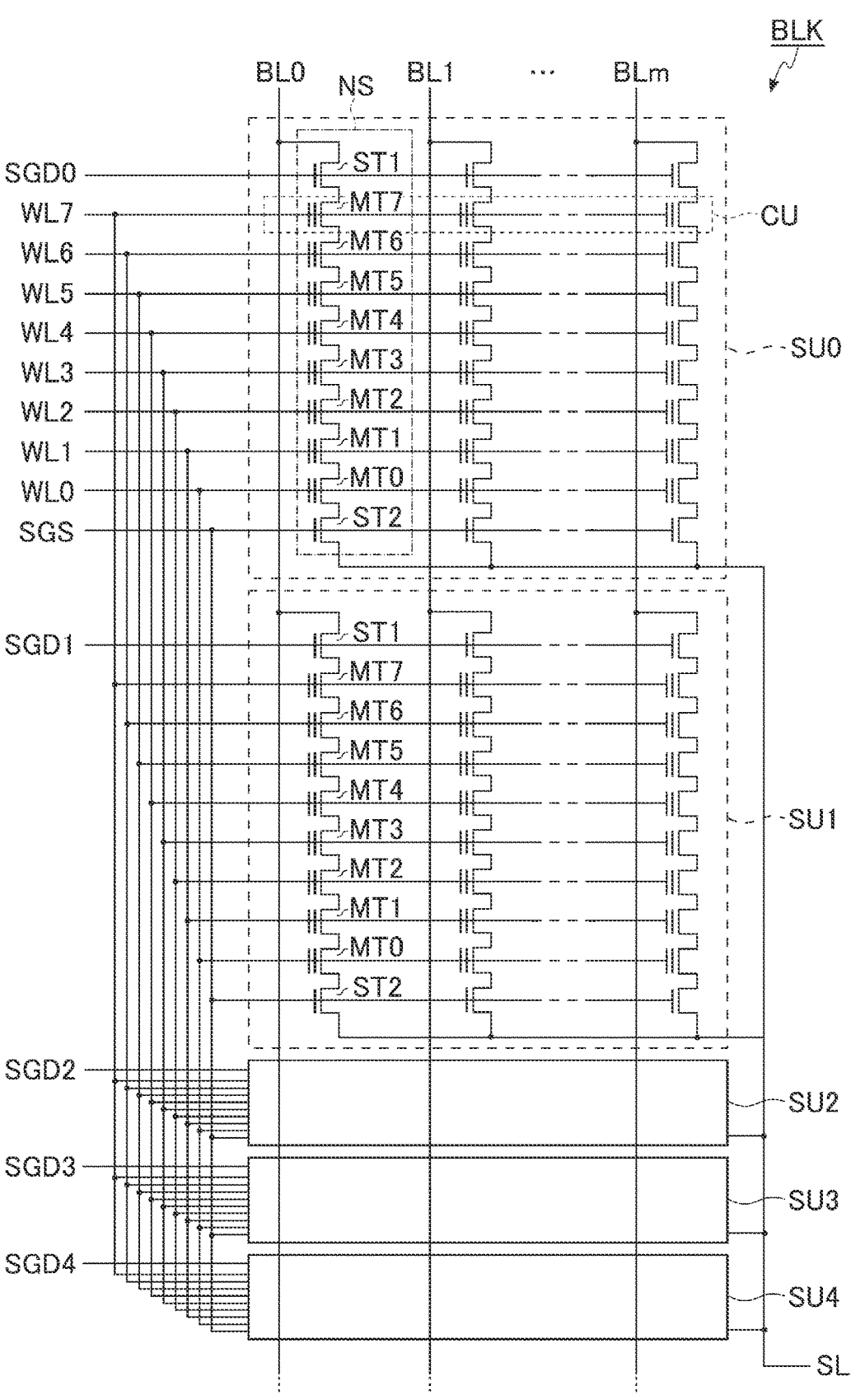
F I G . 2

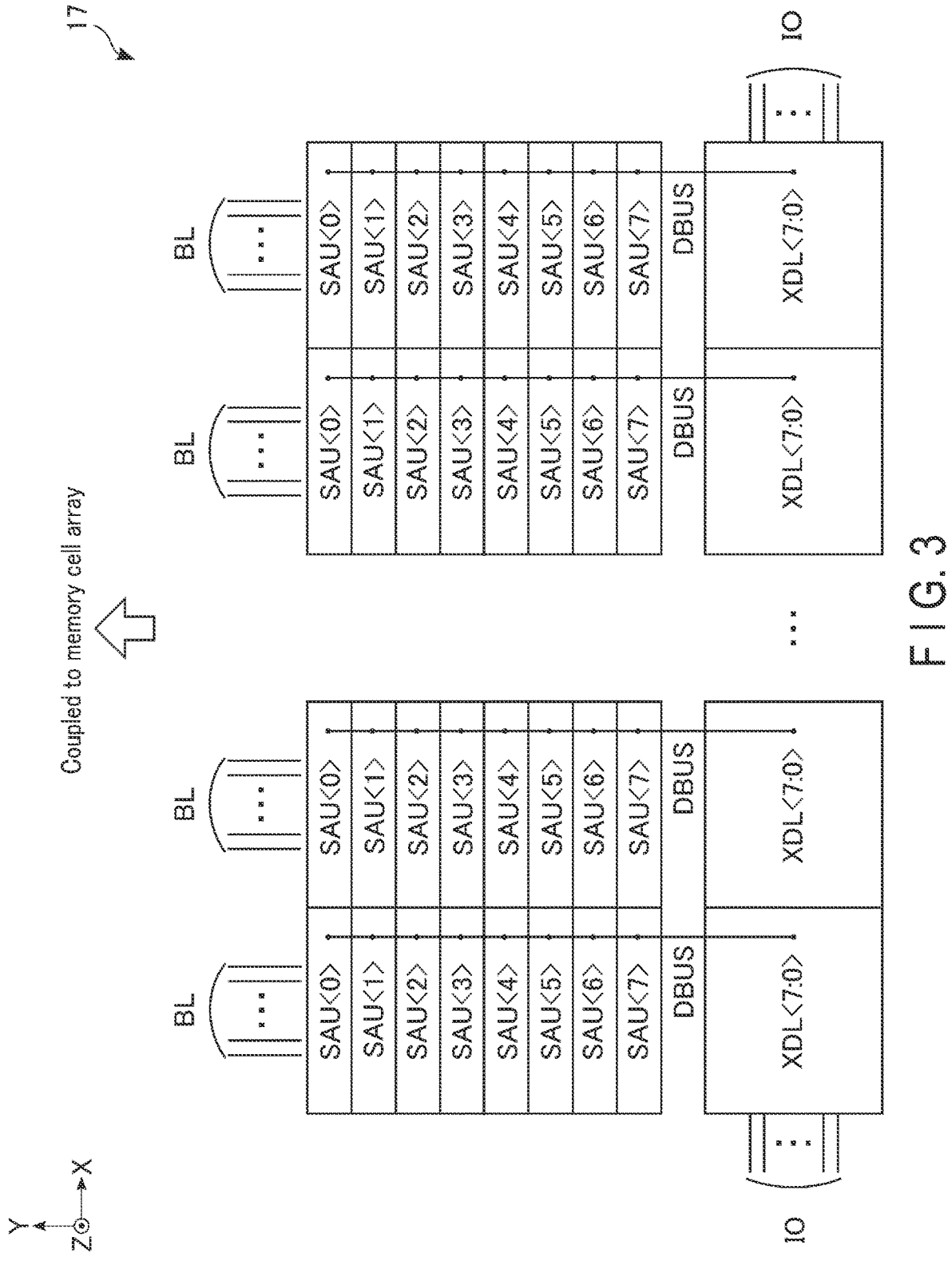
F I G. 3

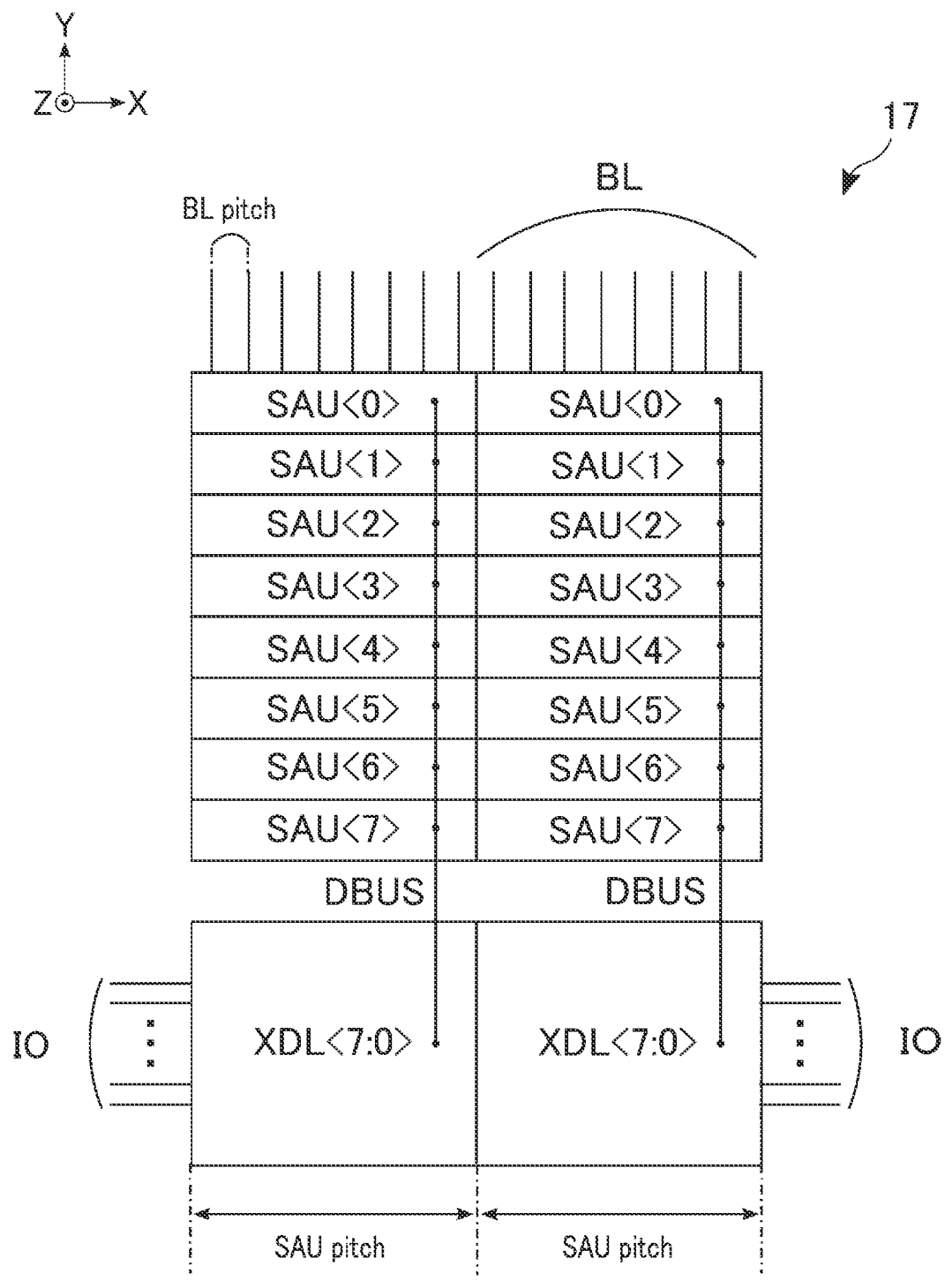
F I G. 4

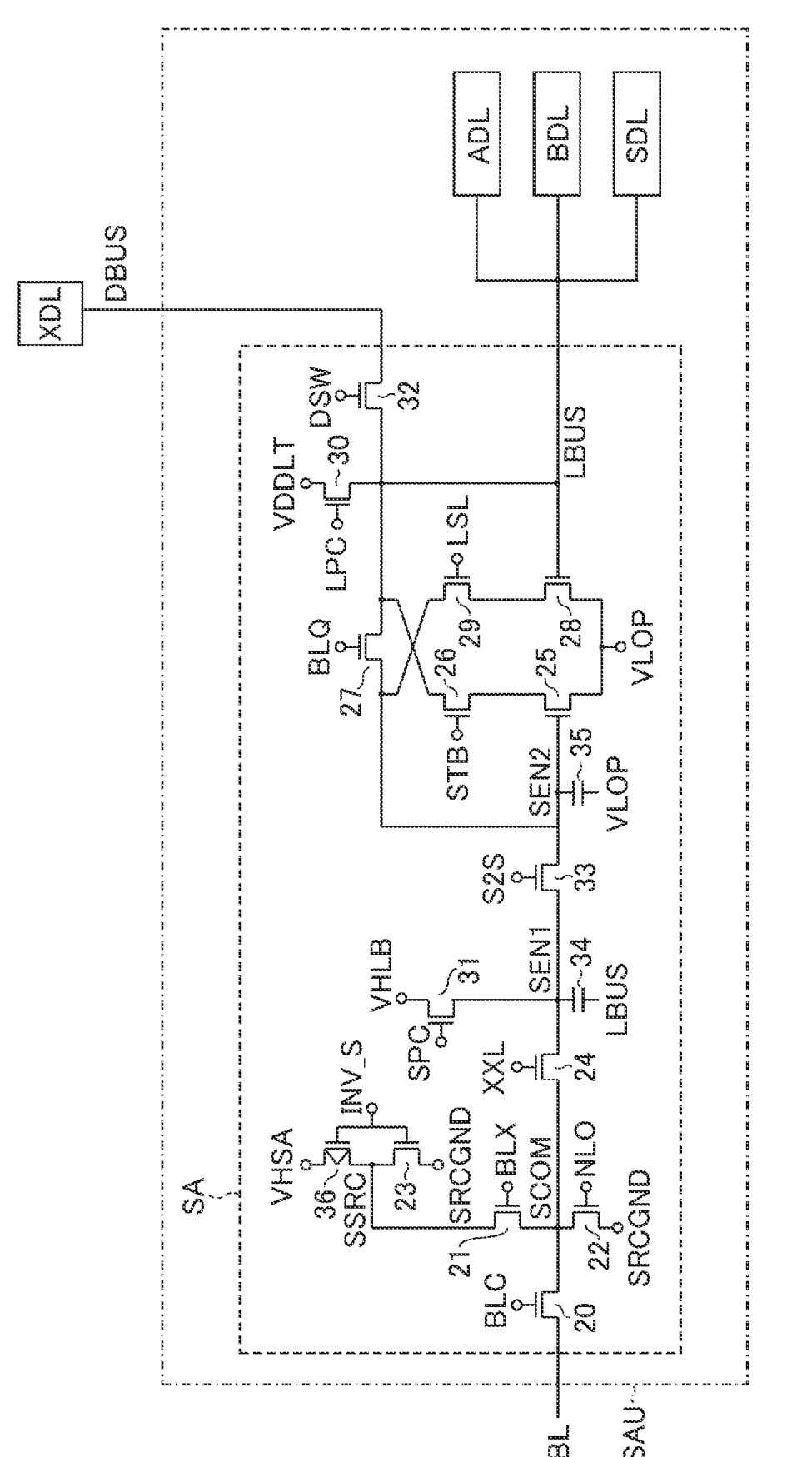
F I G. 5

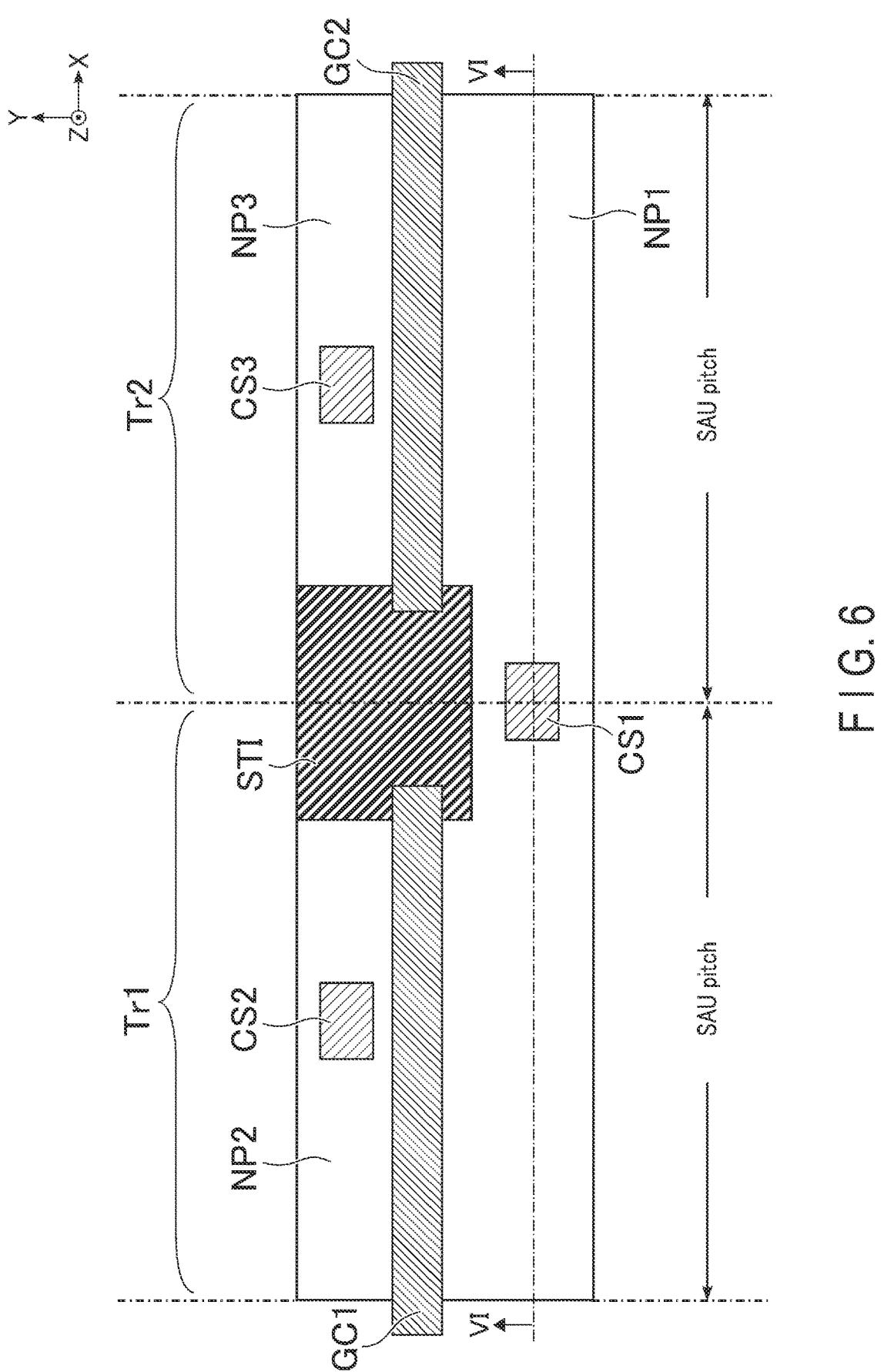
F I G. 6

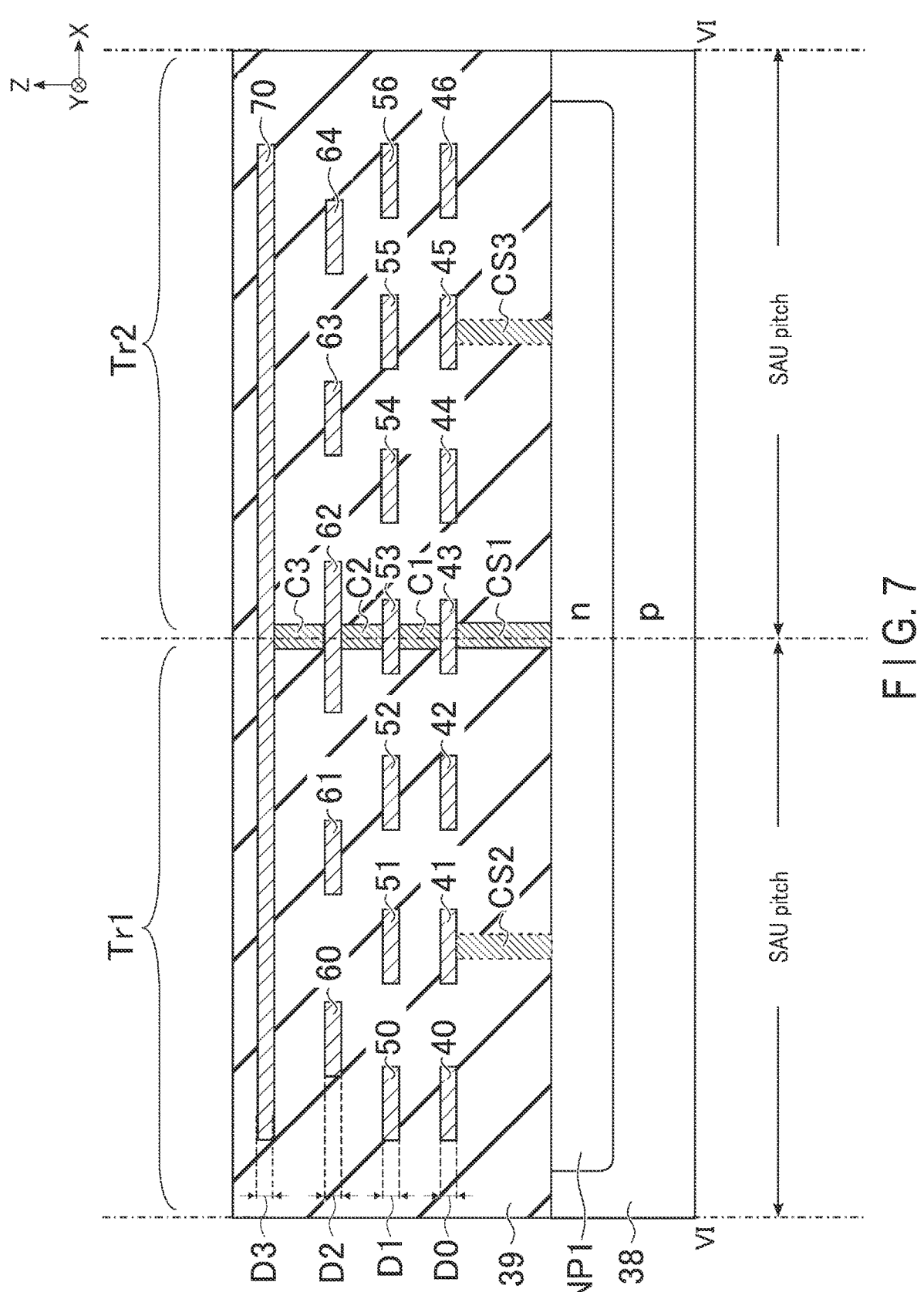
F I G. 7

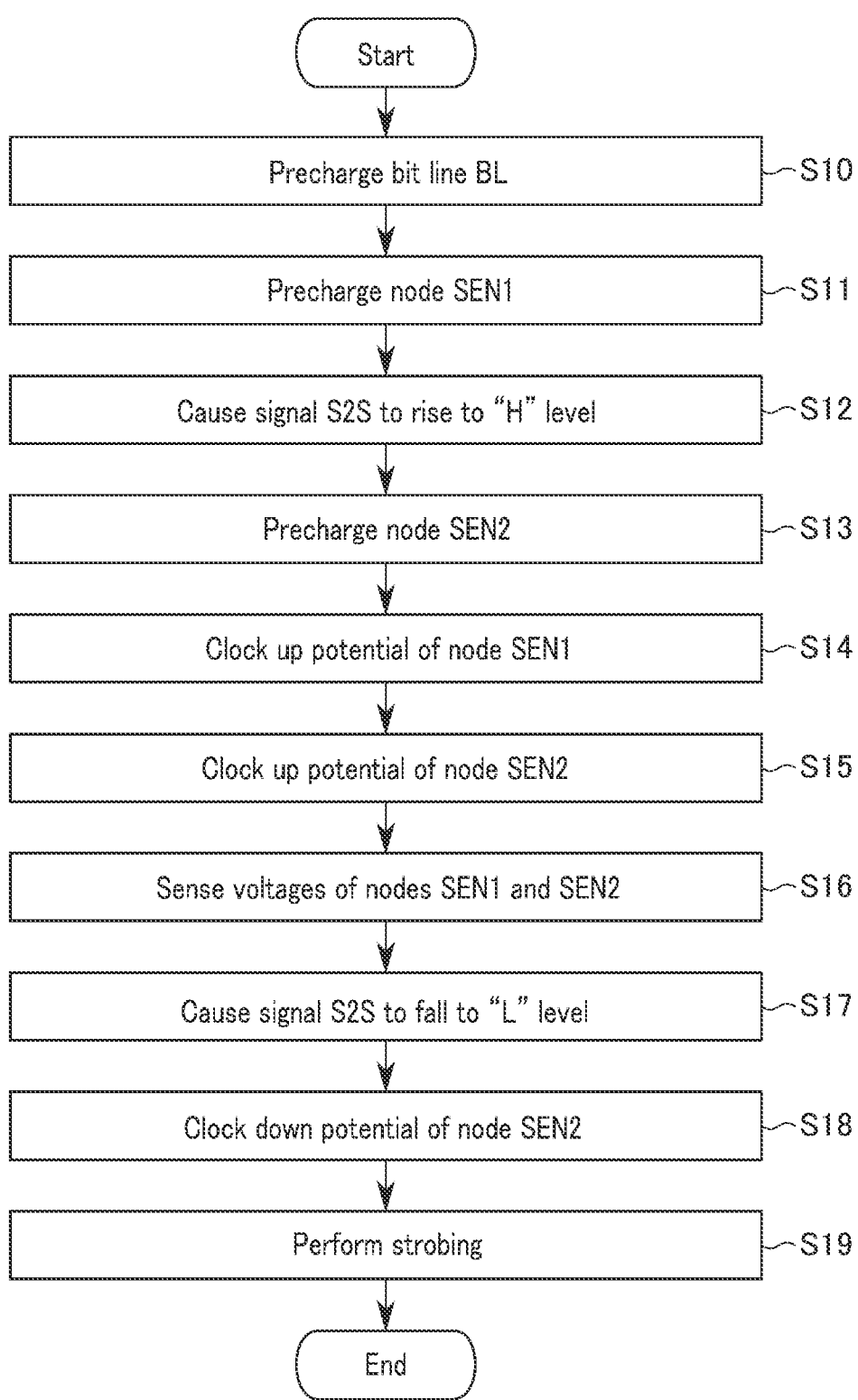
Start
Precharge bit line BL — S10
Precharge node SEN1 — S11
Cause signal S2S to rise to "H" level — S12
Precharge node SEN2 — S13
Clock up potential of node SEN1 — S14
Clock up potential of node SEN2 — S15
Sense voltages of nodes SEN1 and SEN2 — S16
Cause signal S2S to fall to "L" level — S17
Clock down potential of node SEN2 — S18
Perform strobing — S19
End
F I G. 9

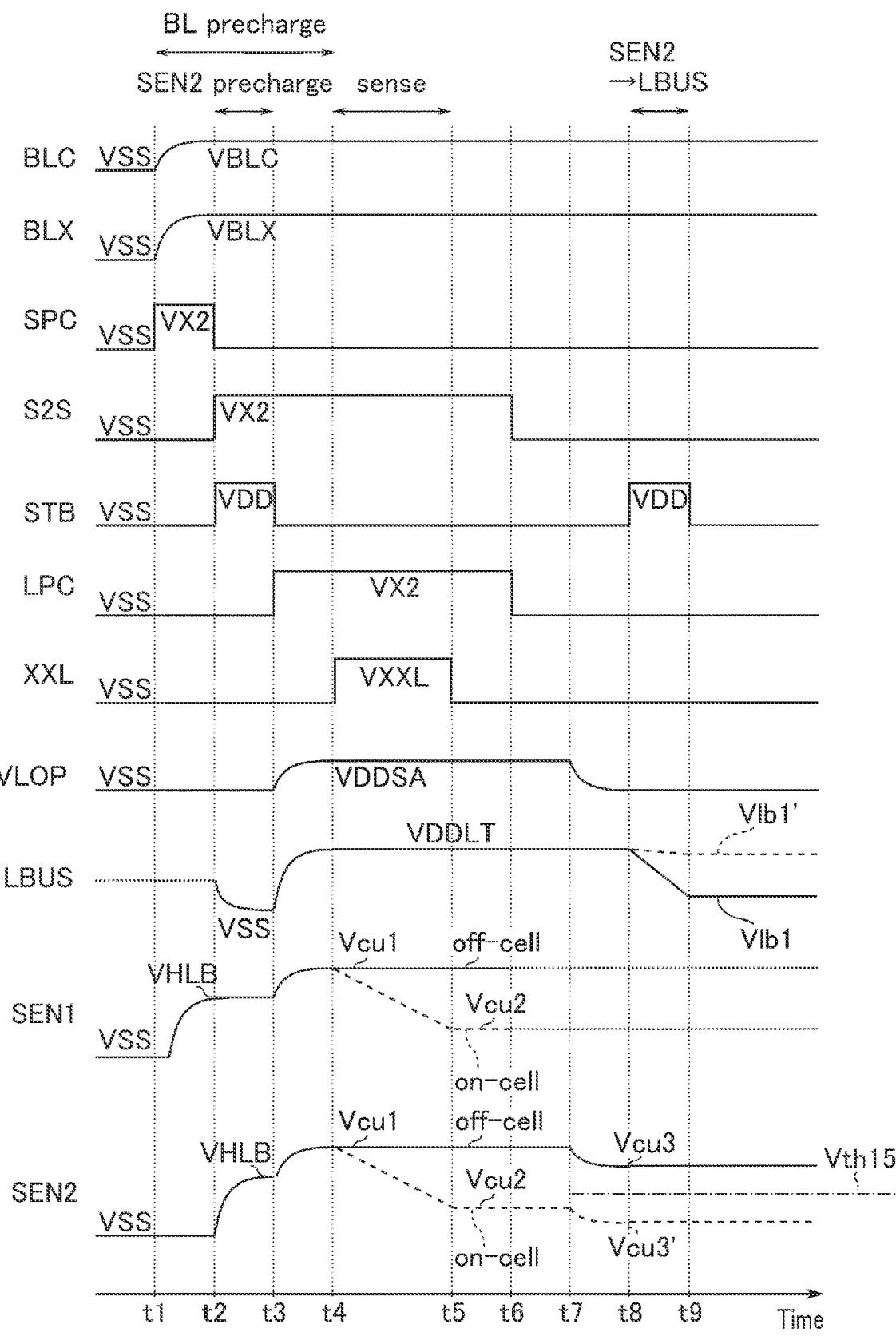
F I G. 10

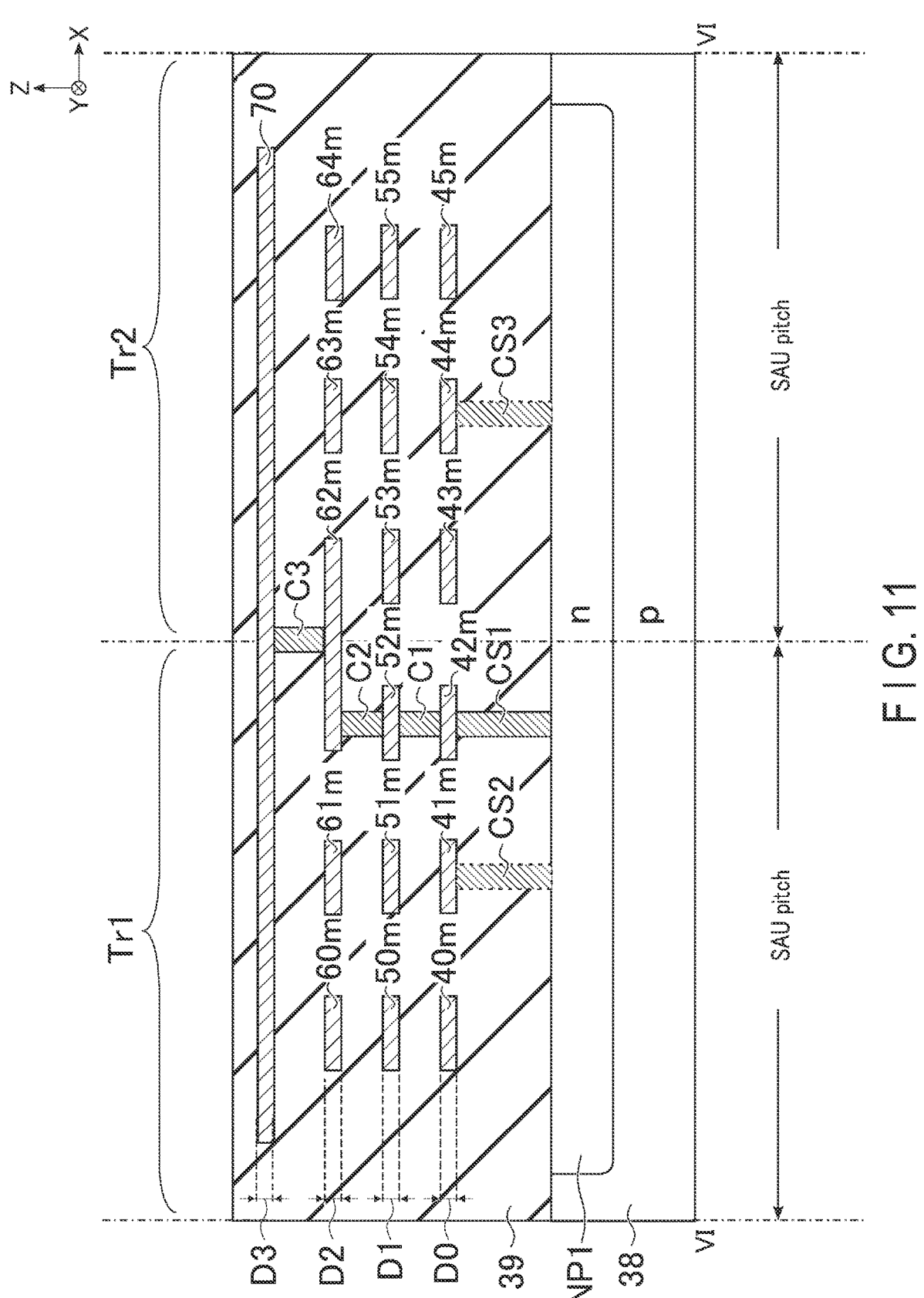
F I G. 11

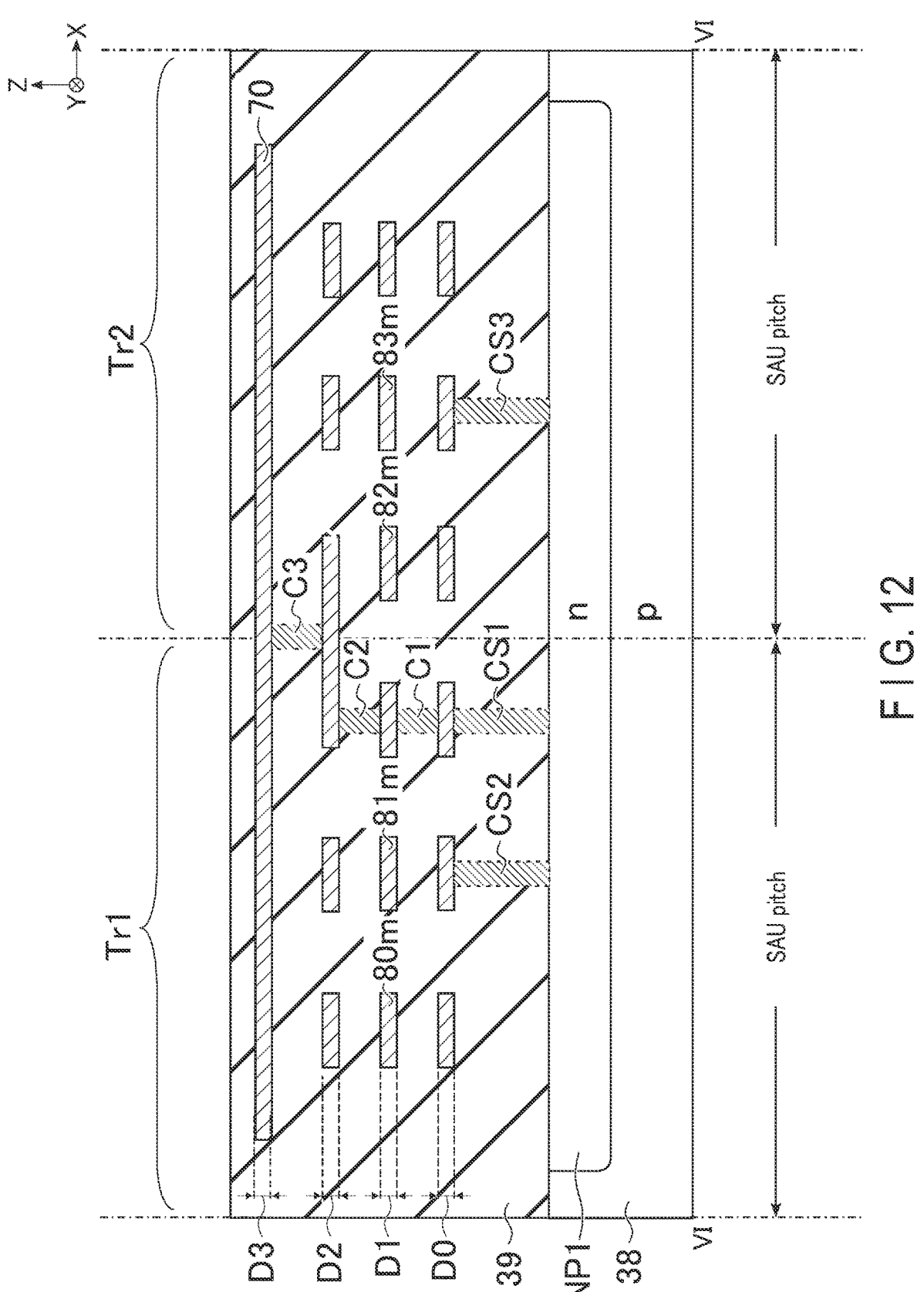
F I G. 12

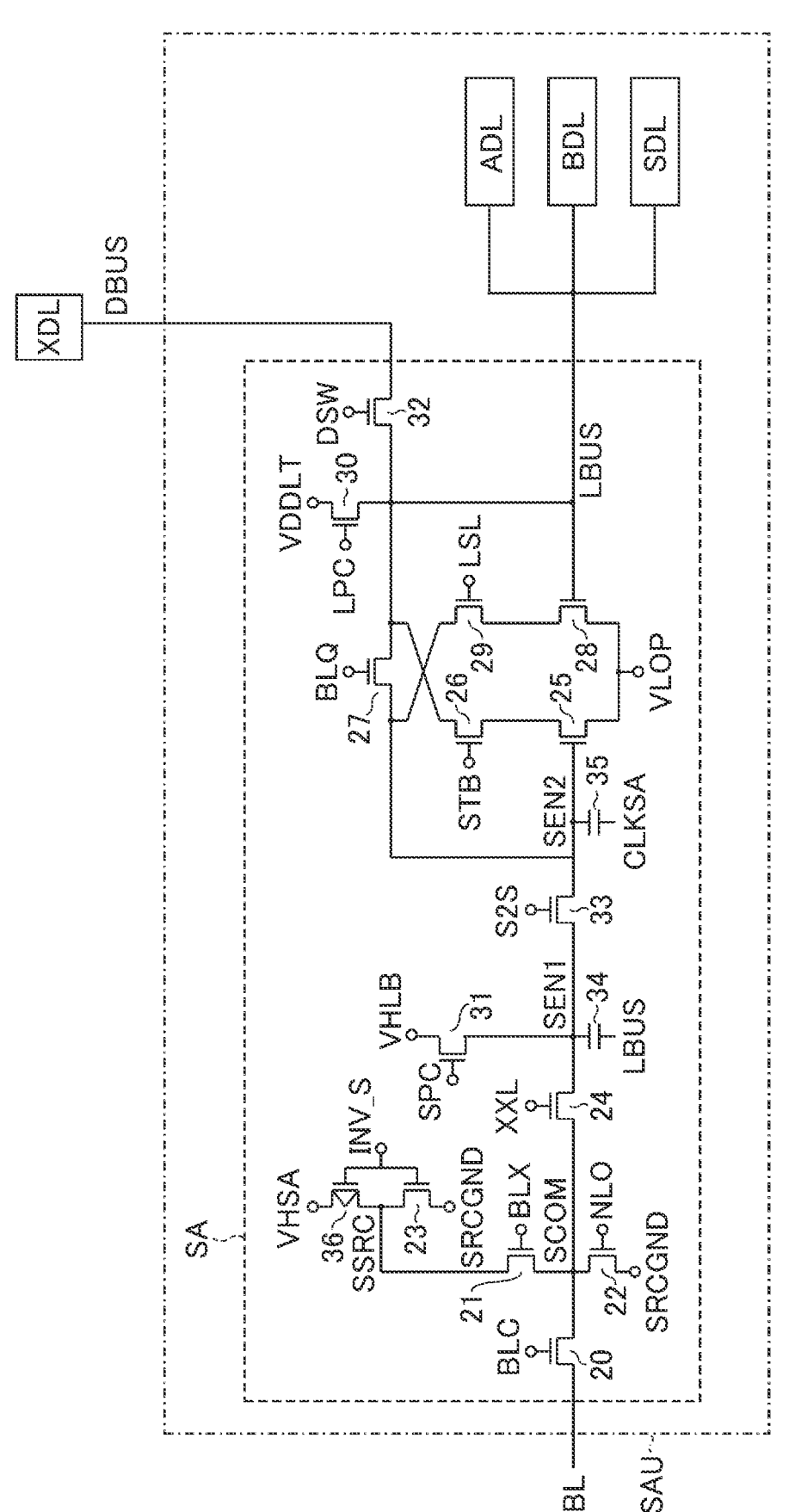
F I G. 13

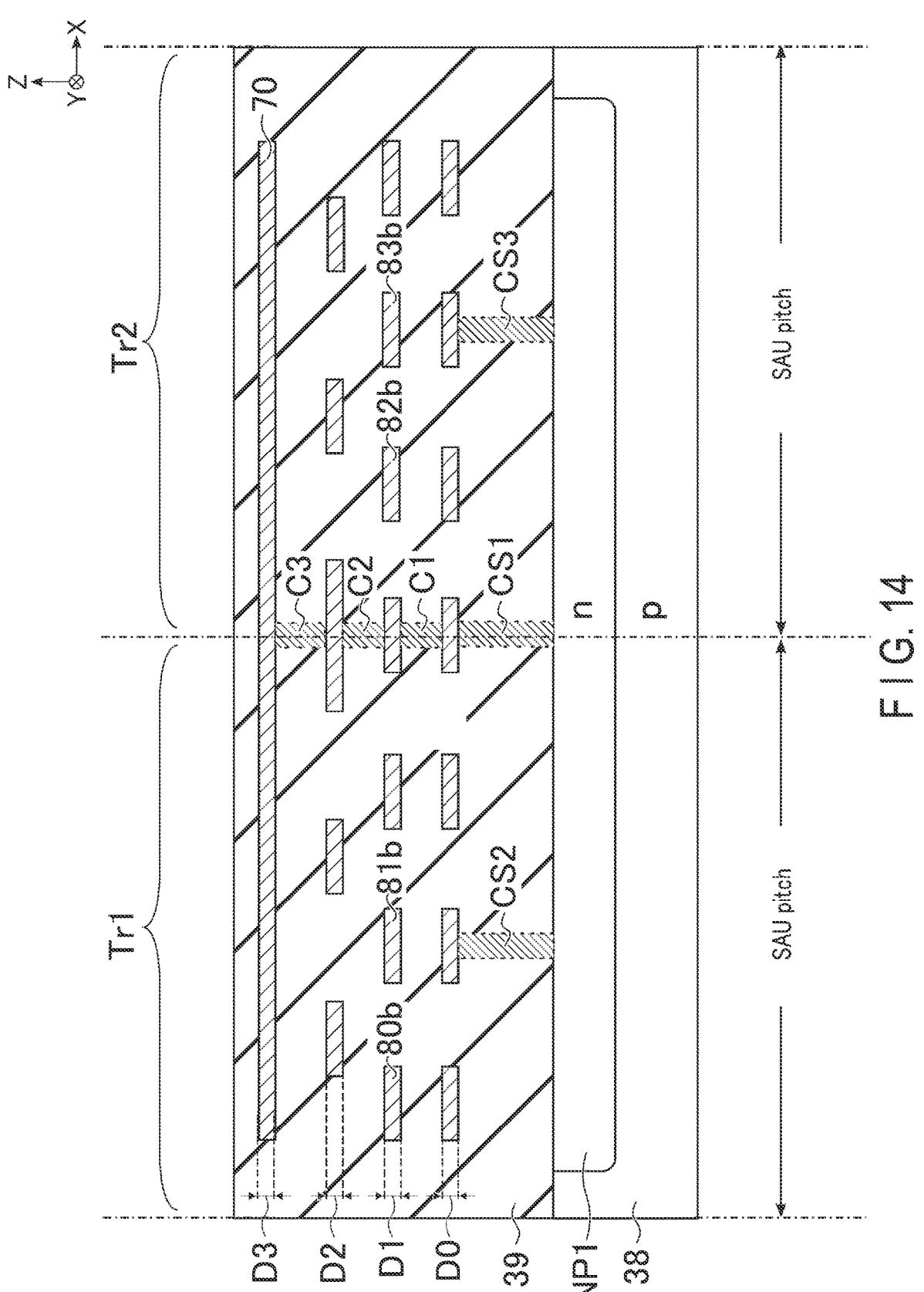
F I G. 14

SEMICONDUCTOR MEMORY DEVICE

CROSS-REFERENCE TO RELATED APPLICATIONS

This application is based upon and claims the benefit of priority from Japanese Patent Application No. 2022-143205, filed Sep. 8, 2022, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 2 illustrates an example of a circuit configuration of a memory cell array included in the semiconductor memory device 1 according to the first embodiment.

FIG. 3 is a block diagram illustrating a configuration example of a sense amplifier included in the semiconductor memory device 1 according to the first embodiment.

FIG. 4 illustrates an example of a layout of a sense amplifier included in the semiconductor memory device 1 according to the first embodiment.

FIG. 5 illustrates an example of a circuit configuration of the sense amplifier unit SAU included in the semiconductor memory device 1 according to the first embodiment.

FIG. 6 illustrates an example of a planar structure of transistors included in the semiconductor memory device 1 according to the first embodiment.

FIG. 7 illustrates a cross-sectional view taken along line VI-VI of FIG. 6, which is an example of the cross-sectional structure of the circuit region of the semiconductor memory device 1 according to the first embodiment.

FIG. 9 is a flowchart illustrating an example of how a read operation is performed in the semiconductor memory device 1 according to the first embodiment.

FIG. 10 illustrates a timing chart, which is an example of voltages of various signals that are applied during the read operation of the semiconductor memory device 1 according to the first embodiment.

FIG. 11 illustrates an example illustrating a cross-sectional structure of a circuit region of a semiconductor memory device 1m according to a modification of the first embodiment.

FIG. 12 illustrates an example of a cross-sectional structure of a circuit region of the semiconductor memory device 1m according to a modification of the first embodiment.

FIG. 13 illustrates an example of the circuit configuration of the sense amplifier unit SAU included in a semiconductor memory device 1b according to the second embodiment.

FIG. 14 illustrates an example of the cross-sectional structure of the circuit region of the semiconductor memory device 1b according to the second embodiment.

DETAILED DESCRIPTION

Figure 1:
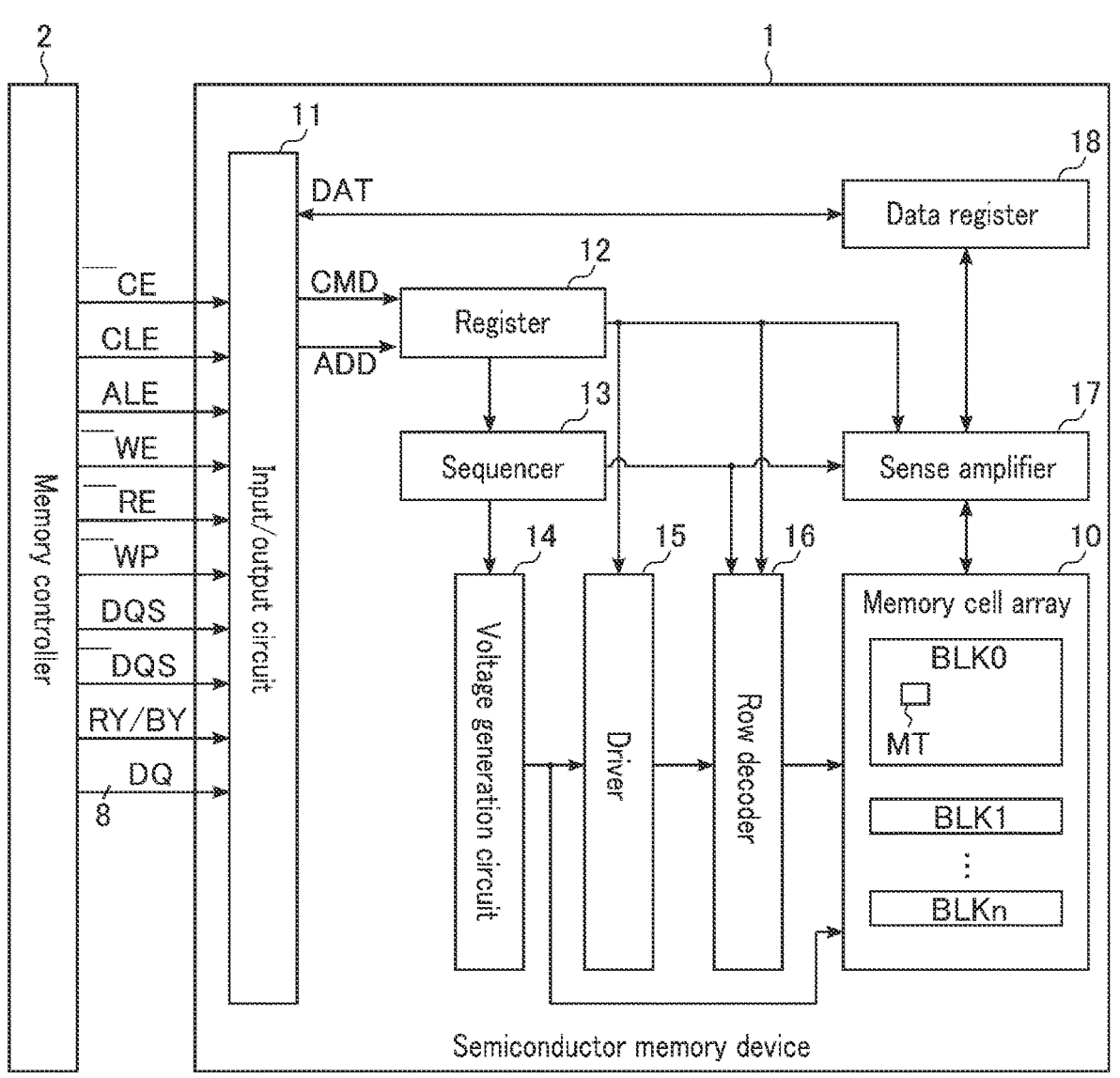
FIG. 1 is a block diagram illustrating a configuration example of a semiconductor memory device 1 according to a first embodiment.

In general, according to one embodiment, a semiconductor memory device includes a first memory cell transistor, a first bit line electrically coupled to the first memory cell transistor, a first sense amplifier electrically coupled to the first bit line, and a first latch circuit electrically coupled to the first sense amplifier. The first sense amplifier includes a first node coupled to the first bit line, a first transistor including one end electrically coupled to the first latch circuit, a second node coupled to a gate of the first transistor, and a second transistor coupled between the first node and the second node. The second transistor is in an ON state during an operation of transferring a charge from the first bit line to the first node and the second node in accordance with data of the first memory cell transistor. The second transistor is in an OFF state during an operation of transferring data of the second node to the first latch circuit.

Embodiments will be described below with reference to the accompanying drawings. In the description set forth below, components having substantially the same functions and configurations will be denoted by the same reference numerals, and a repeated description may be omitted. In order to distinguish components having substantially the same function and configuration from each other, an additional numeral or letter may be added to the end of each reference numeral.

The drawings are schematic and do not exactly show the actual relationships between thicknesses and plan dimensions or actual ratios among the thicknesses of the layers. Therefore, the specific thicknesses and dimensions should be determined in consideration of the descriptions given below. In addition, portions having different dimensional relationships and ratios between the drawings can be included. The descriptions of one embodiment are all applicable to the other embodiments as well unless such application is excluded explicitly or obviously.

In the present specification and claims, "virtually the same," "substantially the same" and "substantially uniform" are intended to be the same, but due to limitations in manufacturing technology and/or measurement technology they refer to the state of not being exactly the same and tolerate errors.

As used in the present specification and claims, where a first element is "coupled" to a different second element, this means that the first element coupled to the second element directly or coupled thereto through an element that is electrically conductive at all times or at selected times. "Electrical coupling" may use an insulator as long as the insulator does not affect the proper operation of the electrical coupling.

In the descriptions set forth below, a Cartesian coordinate system consisting of X, Y and Z axes will be used. In the descriptions below, the description "bottom" and its derivatives and related words refer to the position of a smaller coordinate on the Z axis, and the description "top" and its derivatives and related words refer to the position of a larger coordinate on the Z axis.

In the drawings, hatching is appropriately added to enhance the visibility of the drawings. The hatching added to the drawings is not necessarily related to the materials or characteristics of the hatched components. In the drawings, components such as insulating layers (interlayer insulating films), substrates, wirings, and contacts are omitted where appropriate to enhance the visibility of the drawings.

<1> First Embodiment

A semiconductor memory device 1 according to the first embodiment will be described below. The semiconductor memory device 1 is, for example, a NAND flash memory. The descriptions below are based on an example in which semiconductor memory device 1 is a NAND flash memory.
<1-1> Configuration (Structure)
<1-1-1> Overall Configuration of Semiconductor Memory Device 1

FIG. 1 illustrates components and connections of the semiconductor memory device 1 of the first embodiment along with related components. As shown in FIG. 1, the semiconductor memory device 1 is controlled by a memory controller 2. The memory controller 2 receives an instruction from a host device (not shown) and controls the semiconductor memory device 1 based on the received instruction.

The semiconductor memory device 1 is coupled to the memory controller 2 through a NAND bus. The NAND bus enables transmission of a plurality of control signals and an input/output signal DQ having a width of 8 bits. The control signals include signals ⁻CE, CLE, BLE, ⁻WE, ⁻RE and ⁻WP, data strobe signals DQS and/DQS and a ready/busy signal RB. The symbol "⁻" indicates inversion logic. The semiconductor memory device 1 receives and transmits the input/output signal DQ. The input/output signal DQ includes a command (CMD), write data or read data (DAT), address information (ADD) and a status (STA).

The signal ⁻CE is a signal for enabling the semiconductor memory device 1. The signal CLE notifies the semiconductor memory device 1 that a command is transmitted by the input/output signal DQ. The signal ALE notifies the semiconductor memory device 1 that an address signal is transmitted by the input/output signal DQ. The signal ⁻WE instructs the semiconductor memory device 1 to receive the input/output signal DQ. The signal ⁻RE instructs the semiconductor memory device 1 to output the input/output signal DQ. The ready/busy signal RY/BY indicates whether the semiconductor memory device 1 is in a ready state or a busy state and indicates a busy state where it is at a low level. The semiconductor memory device 1 accepts a command where it is in the ready state and does not accept the command where it is in the busy state.

The semiconductor memory device 1 includes components such as a memory cell array 10, an input/output circuit 11, a register 12, a sequencer 13, a voltage generation circuit 14, a driver 15, a row decoder 16, a sense amplifier 17, a data register (data cache) 18, etc.

The memory cell array 10 is a set of arranged memory cells. The memory cell array 10 includes a plurality of memory blocks (blocks) BLK (BLK0, BLK1, . . . ). Each block BLK includes a plurality of memory cell transistors MT. Word lines WL (not shown) and bit lines BL (not shown) are also located in the memory cell array 10.

The input/output circuit 11 is coupled to the memory controller 2 by wirings that are based on a NAND memory interface.

The register 12 is a circuit that holds the command CMD and address information ADD received by the memory controller 2. The command CMD instructs the sequencer 13 to perform various operations including data read, data write, and data erase. The address information ADD includes, for example, a block address, a page address and a column address. The block address, page address, and column address designate a block BLK, a word line WL and a bit lines BL, respectively.

The sequencer 13 is a circuit that controls the overall operation of the semiconductor memory device 1. The sequencer 13 controls the voltage generation circuit 14, the row decoder 16 and the sense amplifier 17, based on the command CMD received from the register 12, to perform various operations including data read, data write and data erase.

The voltage generation circuit 14 is a circuit that generates a plurality of voltages of different magnitudes. The voltage generation circuit 14 receives a power supply voltage from outside the semiconductor memory device 1 and generates a plurality of voltages from the received power supply voltage. The generated voltage is supplied to components such as the memory cell array 10 and the driver 15. By application of various voltages, voltages are applied to various components and wirings in the semiconductor memory device 1.

The driver 15 is a circuit that applies several components with various voltages required for the operation of the semiconductor memory device 1. The driver 15 receives a plurality of voltages from the voltage generation circuit 14 and supplies selected ones of the plurality of voltages to the row decoder 16.

The row decoder 16 is a circuit for selecting a block BLK. The row decoder 16 transfers a potential supplied from the driver 15 to one block BLK that is selected based on the block address received from the register 12.

The sense amplifier 17 is a circuit that determines data stored in the memory cell array 10. The sense amplifier 17 senses the states of the memory cell transistors MT, and based on the sensed state, generates read data or transfers write data to the memory cell transistors MT.

The data register 18 is a circuit that holds data for data input and output by the semiconductor memory device 1. The data register 18 receives data DAT received by the semiconductor memory device 1 and supplies data based on the received data DAT to the sense amplifier 17. The data register 18 receives data from the sense amplifier 17 and supplies data DAT based on the received data to the input/output circuit 11.
<1-1-2> Circuit Configuration of Memory Cell Array 10

FIG. 2 is a circuit diagram illustrating an example of a circuit configuration of the memory cell array 10 provided in the semiconductor memory device according to the first embodiment. FIG. 2 illustrates one block BLK that is extracted from among a plurality of blocks BLK included in the memory cell array 10. For example, the other blocks BLK are all constructed from components and connections similar to those shown in FIG. 2. The number of blocks BLK included in the memory cell array 10 and the number of string units SU included in one block BLK can be set to any numbers. The descriptions below are based on an example where one block BLK includes five string units SU0-SU4.

Each string unit SU includes a plurality of NAND strings NS respectively associated with bit lines BL0 to BLm (m is an integer of 1 or more). Each NAND string NS includes a plurality of memory cell transistors, e.g., memory cell transistors MT0-MT7, and select transistors ST1 and ST2. The descriptions below are based on an example where each NAND string NS includes eight memory cell transistors MT0-MT7.

Each of the memory cell transistors MT includes a control gate and a charge accumulation layer and stores data in a nonvolatile manner. The select transistors ST1 and ST2 are used for selecting a string unit SU during various operations.

In each NAND string NS, the memory cell transistors MT0-MT7 are coupled in series. The drain of the select transistor ST1 is coupled to the associated bit line BL. The source of the select transistor ST1 is coupled to one end of the set of the memory cell transistors MT0-MT7. The other end of the set of the memory cell transistors MT0-MT7 is coupled to the drain of the select transistor ST2. The source of the select transistor ST2 is coupled to the source line SL.

In the same block BLK, control gates of the memory cell transistors MT0-MT7 are coupled to word lines WL0 to WL7, respectively. The gates of the select transistors ST1 in the string units SU0-SU4 are coupled to select gate lines SGD0-SGD4, respectively. The gates of the plurality of select transistors ST2 are coupled to the select gate line SGS.

Column addresses are assigned to the bit lines BL0-BLm. Each bit line BL is shared by NAND strings NS of a plurality of blocks BLK. The word lines WL0-WL7 are provided for each block BLK. The source line SL is shared, for example, by a plurality of blocks BLK.

A set of memory cell transistors MT coupled to a common word line WL in one string unit SU are referred to, for example, as a cell unit CU. For example, the storage capacity of the cell unit CU including memory cell transistors MT each storing 1-bit data is defined as "1 page data." The cell unit CU may have a storage capacity of two-page data or more in accordance with the number of bits of data stored in the memory cell transistor MT.

The circuit configuration of the memory cell array 10 provided in the semiconductor memory device 1 according to the first embodiment is not limited to the configuration described above. For example, the numbers of memory cell transistors MT and select transistors ST1 and ST2 included in each NAND string NS may be designed as arbitrary numbers.

<1-1-3> Configuration of Sense Amplifier 17

FIG. 3 is a block diagram of the sense amplifier 17 included in the semiconductor memory device 1 according to the first embodiment. As shown in FIG. 3, the sense amplifier 17 includes a plurality of sense amplifier units SAU and a plurality of latch circuits XDL.

The sense amplifiers unit SAU are provided for each bit line BL. Each sense amplifier units SAU senses data read from the coupled bit line BL during a data read operation, and transfers write data to the coupled bit line BL during a data write operation. In FIG. 3, eight sense amplifier units SAU are commonly coupled to one bus DBUS. Any number of sense amplifier units SAU can be coupled to one bus DBUS. In the descriptions below, the eight sense amplifier units SAU commonly coupled to one bus DBUS will be indicated as SAU<0>-SAU<7>, respectively, where they have to be distinguished from each other.

The latch circuit XDL is provided for the sense amplifier units SAU and temporarily stores data related to coupled bit line BL. In FIG. 3, eight latch circuits XDL<7:0> respectively corresponding to the sense amplifier units SAU<0>-SAU<7> are commonly coupled to one bus DBUS. It should be noted that the eight latch circuits XDL<7:0> may be coupled to eight buses DBUS, respectively.

Each latch circuit XDL is coupled to a data line IO. Each latch circuit XDL is used for data transmission/reception between the sense amplifier units SAU and the outside thereof via the bus DBUS and the data line IO. That is, data received from the controller is first stored in the latch circuit XDL via the data line IO and then transferred to the sense amplifier unit SAU via the bus DBUS. The same holds true with respect to data transmitted in the opposite direction.

FIG. 4 illustrates an example of a layout of the sense amplifier 17 included in the semiconductor memory device 1 according to the first embodiment. As shown in FIG. 4, the bit lines BL extend along the Y axis and line up along the X axis. The distance between the bit lines BL adjacent along the X axis may be hereinafter referred to as a "BL pitch."

A sense amplifier unit SAU<0> is adjacent to another sense amplifier unit SAU<0> along the X axis. The width of one sense amplifier unit SAU along the X axis may be hereinafter referred to as "SAU pitch."

<1-1-4> Circuit Configuration of Sense Amplifier Unit SAU

A circuit configuration of the sense amplifier unit SAU will be described with reference to FIG. 5. FIG. 5 is a circuit diagram of the sense amplifier unit SAU included in the semiconductor memory device 1 according to the first embodiment.

FIG. 5 illustrates an example of the circuit configuration of the sense amplifier unit SAU by extracting and showing one sense amplifier unit SAU from among a plurality of sense amplifier units SAU included in the sense amplifier 17. The other sense amplifier units SAU all have a configuration similar to that shown in FIG. 5. The sense amplifier unit SAU includes a sense circuit SA and a number of latch circuits, for example three latch circuits SDL, ADL and BDL.

In a data read operation, the sense circuit SA senses data read from the bit line BL and determines whether the read data is "0" or "1." In a data write operation, the sense circuit SA applies a voltage to the bit line BL, based on write data. Also, the sense circuit SA performs an AND operation or an OR operation, using data in the latch circuits SDL, ADL and BDL.

Details of the sense circuit SA will be described. In the descriptions below, one of the source and drain of a transistor may be referred to as "one end of the current path," and the other of the source and drain may be referred to as "the other end of the current path."

The sense circuit SA includes n-channel MOS transistors 20-33, a p-channel MOS transistor 36 and capacitance elements 34 and 35.

The gate of the transistor 20 receives a signal BLC. One end of the current path of the transistor 20 is coupled to bit line BL, and the other end of the current path of the transistor 20 is coupled to a node SCOM. The transistor 20 is for clamping the coupled bit line BL to a voltage corresponding to the signal BLC.

The gate of the transistor 21 receives a signal BLX. One end of the current path of the transistor 21 is coupled to the node SCOM, and the other end of the current path of the transistor 21 is coupled to a node SSRC.

The gate of the transistor 22 receives a signal NLO. One end of the current path of the transistor 22 is coupled to the node SCOM, and the other end of the current path of the transistor 22 is coupled to a node SRCGND. A ground voltage VSS, for example, is applied to the node SRCGND. The transistor 22 is for charging or discharging the coupled bit line BL.

The gate of the transistor 23 is coupled to a node INV_S. One end of the current path of the transistor 23 is coupled to the node SSRC, and the other end of the current path of the transistor 23 is coupled to the node SRCGND.

The gate of the transistor 24 receives a signal XXL. One end of the current path of the transistor 24 is coupled to the node SCOM, and the other end of the current path of the transistor 24 is coupled to a node SEN1. The transistor 24 is for controlling the period in which data in the memory cell transistor MT is sensed. Details of the function of the node SEN1 will be described later.

The gate of the transistor 31 receives a signal SPC. One end of the current path of the transistor 31 is coupled to the node SEN1, and the other end of the current path of the transistor 31 is applied with a voltage VHLB. The voltage VHLB is, for example, a power supply voltage VDD. With the transistor 31 turned on and the voltage VHLB transferred to the node SEN1, the node SEN1 is precharged.

The gate of the transistor 33 receives a signal S2S. One end of the current path of the transistor 33 is coupled to the node SEN1, and the other end of the current path of the transistor 33 is coupled to a node SEN2. With the transistor 33 turned off, the node SEN1 and the node SEN2 can be isolated from each other.

The nodes SEN1 and SEN2 function as sense nodes for sensing data in the target memory cell transistor MT during data read. More specifically, during read, the charges pre-charged in the nodes SEN1 and SEN2 (capacitance elements 34 and 35) are transferred to the bit line BL in accordance with the ON state or OFF state of the target memory cell transistor MT. Data is read by sensing the voltages of the nodes SENT and SEN2 at this time.

The gate of the transistor 25 is coupled to the node SEN2. One end of the current path of the transistor 25 is coupled to one end of the current path of the transistor 26, and the other end of the current path of the transistor 25 is coupled to a node VLOP. A voltage VLOP is applied to the node VLOP. The voltage VLOP will be described later.

The gate of the transistor 26 receives a signal STB. The other end of the current path of the transistor 26 is coupled to a bus LBUS.

The gate of the transistor 27 receives a signal BLQ. One end of the current path of the transistor 27 is coupled to the node SEN2, and the other end of the current path of the transistor 27 is coupled to the bus LBUS.

The gate of the transistor 28 is coupled to the bus LBUS. One end of the current path of the transistor 28 is coupled to one end of the current path of the transistor 29, and the other end of the current path of the transistor 28 is coupled to the node VLOP.

The gate of the transistor 29 receives a signal LSL. The other end of the current path of the transistor 29 is coupled to the node SEN2.

The gate of the transistor 30 receives a signal LPC. One end of the current path of the transistor 30 is coupled to the bus LBUS, and the other end of the current path of the transistor 30 is applied with a voltage VDDLT. The voltage VDDLT is, for example, a voltage lower than the voltage VHLB. With the transistor 30 turned on and the voltage VDDLT transferred to the bus LBUS, the bus LBUS is precharged.

The gate of the transistor 32 receives a signal DSW. One end of the current path of the transistor 32 is coupled to the bus LBUS, and the other end of the current path of the transistor 32 is coupled to a bus DBUS. The transistor 32 is a bus switch for coupling the bus LBUS and the bus DBUS. This bus switch couples the sense circuit SA and the latch circuit XDL.

The gate of the transistor 36 is coupled to a node INV_S. A voltage VHSA is applied to one end of the current path of the transistor 36, and the other end of the current path of the transistor 36 is coupled to a node SSRC. The voltage VHSA is, for example, a power supply voltage VDD.

One electrode of the capacitance element 34 is coupled to the node SENT, and the other electrode of the capacitance element 34 is coupled to the bus LBUS.

One electrode of the capacitance element 35 is coupled to the node SEN2, and the other electrode of the capacitance element 35 is coupled to the node VLOP.

In each sense amplifier unit SAU, the sense circuit SA and the three latch circuits SDL, ADL and BDL are coupled to each other by the bus LBUS so that they can transmit and receive data to and from each other.

In the sense amplifier unit SAU having the above con-figuration, the various signals are provided by the sequencer 13, for example.

The latch circuits SDL, ADL and BDL temporarily store data. In a data write operation, the sense circuit SA controls the bit lines BL in accordance with the data stored in the latch circuit SDL. The other latch circuits ADL and BDL are used to temporarily store data of each bit, for example, where each memory cell transistor MT stores two or more bits of data. It should be noted that any number of latch circuits can be provided; for example, the number of latch circuits can be determined in accordance with the amount of data (number of bits) that can be stored in the memory cell transistor MT.

<1-2> Structure of Wirings

FIG. 6 illustrates an example of a planar structure of a transistor included in the semiconductor memory device 1 according to the first embodiment. FIG. 6 illustrates part of the circuit region of the semiconductor memory device 1 and illustrates part of the sense amplifier unit SAU shown in FIG. 4 and part of another sense amplifier unit SAU that is adjacent to the sense amplifier unit SAU along the X axis. In the sense amplifier units SAU adjacent along the X axis, for example, a set of transistors capable of sharing a power supply can have such a structure as shown in FIG. 6.

In the sense amplifier units SAU adjacent along the X axis, the set of transistors capable of sharing the power supply includes, for example, transistors Tr1 and Tr2 and an element isolation region STI. The transistor Tr1 may be one of transistors 20-33 and 36 included in a first sense amplifier unit SAU. The transistor Tr2 may be one of transistors 20-33 and 36 included in the sense amplifier unit SAU adjacent to the first sense amplifier unit SAU.

The transistor Tr1 includes a first diffusion region NP1, a second diffusion region NP2, a first gate electrode GC1, a contact CS1, and a contact CS2. The contact CS1 is an electrode to which one end of the current path of the transistor Tr1 is coupled. The contact CS2 is an electrode to which the other end of the current path of the transistor Tr1 is coupled.

The transistor Tr2 includes the first diffusion region NP1, a third diffusion region NP3, a second gate electrode GC2, the contact CS1, and a contact CS3. The contact CS1 is an electrode to which one end of the current path of the transistor Tr2 is coupled. The contact CS3 is an electrode to which the other end of the current path of the transistor Tr2 is coupled.

The transistors Tr1 and Tr2 share the first diffusion region NP1. In other words, the first diffusion region NP1 is provided continuously across the transistors Tr1 and Tr2. A first contact CS1 is provided on the first diffusion region NP1. The transistors Tr1 and Tr2 share the first contact CS1.

In the XY plan view, the second diffusion region NP2 is provided on the opposite side of the first diffusion region NP1 along the Y axis, with the first gate electrode GC1 being interposed therebetween. The first gate electrode GC1 extends along the X axis. The second contact CS2 is provided on the second diffusion region NP2.

In the XY plan view, the third diffusion region NP3 is provided on the opposite side of the first diffusion region NP1 along the Y axis, with the second gate electrode GC2 being interposed therebetween. The second gate electrode GC2 extends along the X axis. A third contact CS3 is provided on the third diffusion region NP3.

The element isolation region STI is provided, for example, to electrically isolate the transistors Tr1 and Tr2 from each other. The element isolation region STI electrically isolates, for example, the second diffusion region NP2 and the third diffusion region NP3 of the transistors Tr1 and Tr2. The element isolation region STI is provided between the second diffusion region NP2 and the third diffusion region NP3. For example, silicon oxide is used for the element isolation region STI.

In the semiconductor memory device 1 according to the first embodiment, the regions of the transistors Tr1 and Tr2 that are along the X axis are shared by the two sense amplifier units SAU. In other words, the SAU pitch, which is the width of one sense amplifier unit SAU along the X axis, is approximately equal to half the width of the regions of the transistors Tr1 and Tr2 that are along the X axis.

A plurality of sets of transistors that can share a power supply (namely, a set of the transistors Tr1 and Tr2 and the element isolation region STI) may be arranged along the Y axis. A set of transistors arranged along the Y axis may be arranged such that they are arranged along the X axis as well.

In other words, the semiconductor memory device 1 may have a structure in which a set of transistors Tr1 and Tr2 and the isolation regions STI are arranged repeatedly. FIG. 6 illustrates a structure in which a pair of transistors Tr1 and Tr2 and the element isolation region STI are extracted from the structure.

FIG. 7 is a cross-sectional view taken along line VI-VI of FIG. 6 and illustrates an example of the cross-sectional structure of the circuit region included in the semiconductor memory device 1 according to the first embodiment. As shown in FIG. 7, in the circuit region, the semiconductor memory device 1 includes, for example, a semiconductor substrate 38 and an insulating layer 39. The insulating layer 39 is provided on the semiconductor substrate 38.

Although not shown in the drawings, a circuit region is provided in part of the semiconductor substrate 38 and the insulating layer 39, and a memory cell array 10 is provided above the insulating layer 39. For example, circuits that are used, for example, for the row decoder 16 and the sense amplifier 17 are provided in the circuit region.

The semiconductor substrate 38 is, for example, a p-type semiconductor substrate. The semiconductor substrate 38 includes, for example, first diffusion regions NP1 of the transistors Tr1 and Tr2. The first diffusion region NP1 is provided on the upper surface (in the vicinity of the surface) of the semiconductor substrate 38, and is doped with phosphorus (P), for example.

The first diffusion region NP1 is arranged apart from a second diffusion region NP2 (not shown) as viewed in the Y direction. The first diffusion region NP1 and the second diffusion region NP2 function as the source (source diffusion layer) or the drain (drain diffusion layer) of the transistor Tr1.

The first diffusion region NP1 is arranged apart from a third diffusion region NP3 (not shown) as viewed in the Y direction. The first diffusion region NP1 and the third diffusion region NP3 function as the source (source diffusion layer) or drain (drain diffusion layer) of the transistor Tr2.

The insulating layer 39 contains, for example, silicon oxide ($SiO_2$). The insulating layer 39 includes, for example, conductive layers 40-46, 50-56, 60-64 and 70 and contacts CS1-CS3 and C1-C3. Each of the conductive layers 40-46, 50-56, 60-64 and 70 and the contacts CS1-CS3 and C1-C3 contains such a metal as tungsten, for example.

The contact CS1 is provided on the first diffusion region NP1. The first diffusion region NP1 and the contact CS1 are electrically coupled to each other. The conductive layer 43 is provided on the contact CS1. The contact C1 is provided on the conductive layer 43. The conductive layer 53 is provided on the contact C1. The contact C2 is provided on the conductive layer 53. The conductive layer 62 is provided on the contact C2. The contact C3 is provided on the conductive layer 62. The conductive layer 70 is provided on the contact C3.

In the descriptions below, the wiring layers provided with the conductive layers 43, 53, 62 and 70 may be referred to as "D0," "D1," "D2" and "D3," respectively.

In the wiring layer D0, the conductive layers 40-46 are arranged in order from the −X side to the +X side. In the wiring layer D1, the conductive layers 50 to 56 are arranged in order from the −X side to the +X side. The conductive layers 50 to 56 are located above the conductive layers 40-46, respectively, as viewed along the Z axis. In the wiring layer D2, the conductive layers 60 to 64 are arranged in order from the −X side to the +X side.

The conductive layers 40-46, 50-56 and 60-64 extend, for example, along the Y axis. The conductive layer 70 extends, for example, along the X axis.

The contact CS2 is provided on a second diffusion region NP2 (not shown). The second diffusion region NP2 and the contact CS2 are electrically coupled to each other. The contact CS2 is provided in a layer including the contact CS1. The contact CS2 is coupled to, for example, the conductive layer 41 located in the wiring layer D0. In the wiring layer D0, the contact CS2 may be coupled to a wiring other than the conductive layer 41.

The contact CS3 is provided on the third diffusion region NP3 (not shown). The third diffusion region NP3 and the contact CS3 are electrically coupled to each other. The contact CS3 is provided in a layer including the contact CS1. The contact CS3 is coupled, for example, to the conductive layer 45 located in the wiring layer D0. In the wiring layer D0, the contact CS3 may be coupled to a wiring other than the conductive layer 45.

The conductive layers 50 and 54 function, for example, as a node SEN1. The conductive layers 51 and 55 function, for example, as a bus LBUS. The conductive layer 56 functions, for example, as a bus DBUS. The conductive layers 60 and 64 function, for example, as bit lines BL. The conductive layer 70 functions as a power supply line. The conductive layers 43, 53 and 62 coupled to the conductive layer 70 function as the power supply line. That is, the conductive layers 43, 53, and 62 and the contacts CS1 and C1-C3 jointly function as the power supply line.

The conductive layer 50 functioning as the node SEN1 and the conductive layer 51 functioning as the bus LBUS are arranged adjacent to each other, so that an inter-wiring capacitance is generated between them. The inter-wiring capacitance between the conductive layer 50 and the conductive layer 51 corresponds to a capacitance element 34 (see FIG. 5).

Similarly, the conductive layer 54 functioning as the node SENT and the conductive layer 55 functioning as the bus LBUS are arranged adjacent to each other, so that an inter-wiring capacitance is generated between them. The inter-wiring capacitance between the conductive layer 54 and the conductive layer 55 corresponds to the capacitance element 34.

The conductive layers 43, 53 and 62 and the set of contacts CS1 and C1-C3 are shared as the power supply for the transistors Tr1 and Tr2. Thus, in the sense amplifier units SAU adjacent along the X axis, for example, the transistors Tr1 and Tr2 can share the power supply.

As described above with reference to FIG. 6, in the semiconductor memory device 1 according to the first embodiment, the regions of the transistors Tr1 and Tr2 that are along the X axis are shared by two sense amplifier units SAU. That is, in the semiconductor memory device 1, seven wirings (conductive layers) arranged along the X axis are shared by two sense amplifier units SAU. In other words, the SAU pitch is substantially equal to the width of 3.5 wirings arranged along the X axis.

The "SAU pitch is equal to the width of 3.5 wirings arranged along the X axis" may be hereinafter referred to as "the number of tracks of the sense amplifier units SAU is 3.5." That is, the number of tracks is equal to the number of wirings included in the SAU pitch.

Similar to the relationship between the node SENT and the bus LBUS, the conductive layer functioning as the node SEN2 and the conductive layer functioning as the node VLOP are arranged adjacent to each other. Similar to FIG. 7, FIG. 8 illustrates an example of the cross-sectional structure of the circuit region included in the semiconductor memory device 1 according to the first embodiment.

Figure 8:
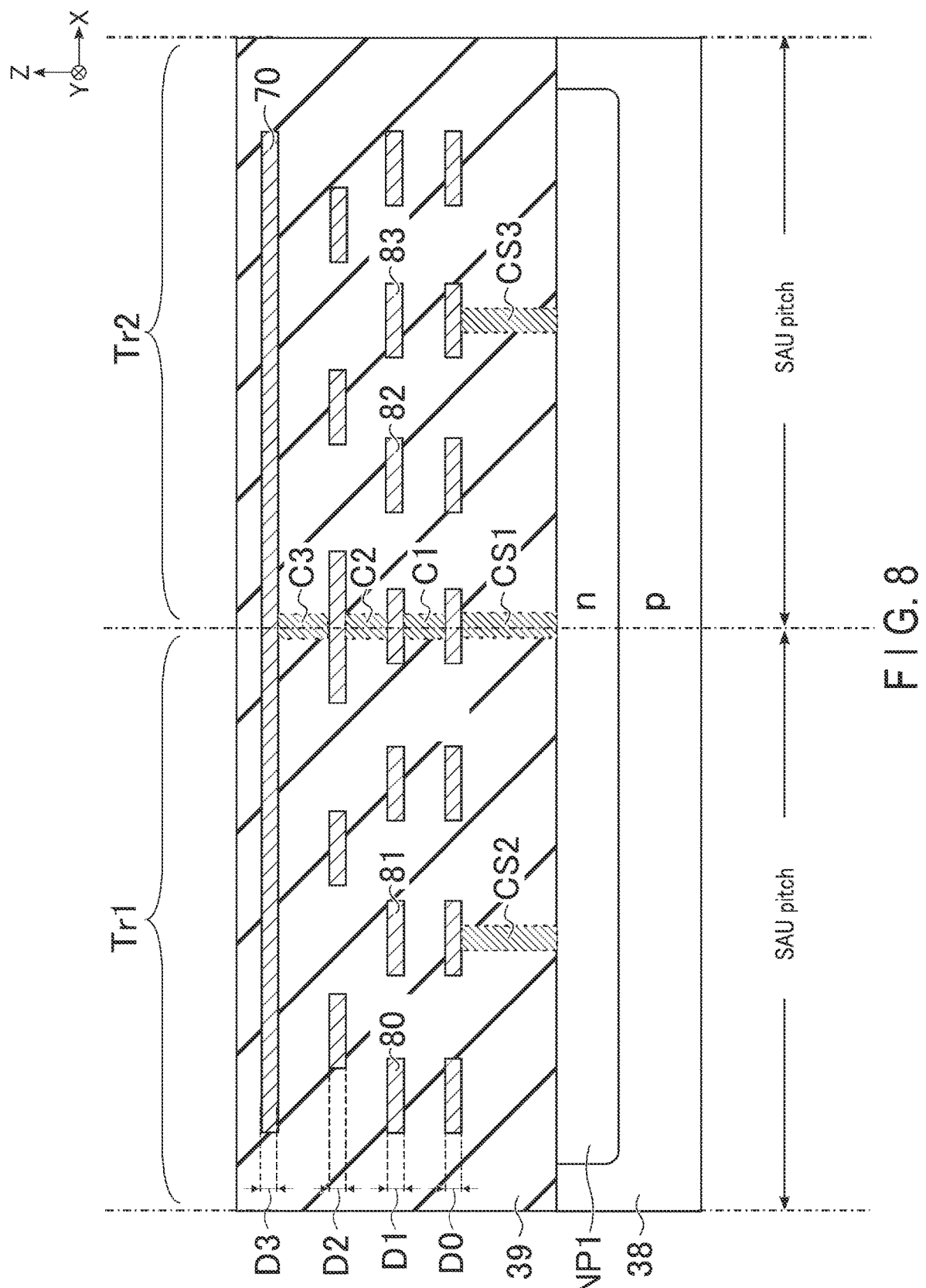
FIG. 8 illustrates an example of a cross-sectional structure of the circuit region of the semiconductor memory device 1 according to the first embodiment.

As shown in FIG. 8, the insulating layer 39 further includes conductive layers 80-83. The conductive layers 80-83 are located in the wiring layer D0 or D1. The conductive layers 80 and 81 are located on the –X side of the set of contacts CS1 and C1-C3. The conductive layer 80 and the conductive layer 81 are adjacent to each other along the X axis.

The conductive layers 82 and 83 are located on the +X side of the set of contacts CS1 and C1-C3. The conductive layer 82 and the conductive layer 83 are adjacent to each other along the X axis.

The conductive layers 80 and 82 function as the node SEN2. The conductive layers 81 and 83 function as the node VLOP.

The conductive layer 80 functioning as the node SEN2 and the conductive layer 81 functioning as the node VLOP are arranged adjacent to each other, so that an inter-wiring capacitance is generated between them. The inter-wiring capacitance between the conductive layer 80 and the conductive layer 81 corresponds to the capacitance element 35 (see FIG. 5).

Similarly, the conductive layer 82 functioning as the node SEN2 and the conductive layer 83 functioning as the node VLOP are arranged adjacent to each other, so that an inter-wiring capacitance is generated between them. The inter-wiring capacitance between the conductive layer 82 and the conductive layer 83 corresponds to the capacitance element 35.

<1-3> Read Operation

FIG. 9 is a flowchart illustrating an example of how a read operation is performed in the semiconductor memory device 1 according to the first embodiment. FIG. 10 is a timing chart illustrating voltages of various signals that are applied during a read operation of the semiconductor memory device 1 according to the first embodiment. An example of the read operation performed in the semiconductor memory device 1 according to the first embodiment will be described below, referring to FIG. 9 as appropriate.

In the first embodiment, the read operation is performed by precharging the nodes SEN1 and SEN2 in the sense circuit SA, transferring the charges precharged to the nodes SEN1 and SEN2 to the bit line BL, and then performing strobing.

As shown in FIG. 9, the semiconductor memory device 1 according to the first embodiment performs, for example, the processes of steps S10-S19 in order in the read operation.

In the process of step S10, the bit line BL is precharged. That is, when the memory cell transistor MT to be read is selected, the sense amplifier 17 precharges the bit line BL.

Specifically, as shown in FIG. 10, at time t1, the sequencer 13 causes a signal BLC to rise from a Low ("L") level (VSS) to a High ("H") level (VBLC) and causes a signal BLX to rise from the "L" level (VSS) to the "H" level (VBLX). The voltage VBLC is a voltage for clamping the voltage of the bit line BL. The voltage VBLX is a voltage that enables the transistor 21 to transfer the voltage VDD. The voltage VBLX is higher than the voltage VBLC. Thus, the transistors 20 and 21 are turned on and the bit line BL is precharged. The bit line BL is kept precharged during the period from time t1 to time t4.

At time t1, the sequencer 13 sets the voltage of the node VLOP to the "L" level (VSS).

In the process of step S11, the node SEN1 is precharged. That is, the sense amplifier 17 precharges the node SEN1 while precharging the bit line BL.

Specifically, as shown in FIG. 10, at time t1, the sequencer 13 causes a signal SPC to rise from the "L" level (VSS) to the "H" level (VX2). The voltage VX2 is a voltage that enables the transistor 31 to transfer a voltage VHLB. Thus, the transistor 31 is turned on, and the node SEN1 is precharged to the voltage VHLB. The bus LBUS is, for example, in a floating state during the period from time t1 to time t2 and takes any voltage value from VSS to VDD.

In the process of step S12, a signal S2S is caused to rise to the "H" level (VX2). Specifically, as shown in FIG. 10, at time t2, the sequencer 13 causes the signal S2S to rise from the "L" level (VSS) to the "H" level (VX2). The voltage VX2 is a voltage that turns on the transistor 33 and causes the node SEN1 and the node SEN2 to have the same potential. Therefore, the transistor 33 is turned on. While the transistor 33 is in the ON state, the nodes SEN1 and SEN2 are connected and have the same potential. By turning off the transistor 33, the potential of the node SEN2 and the potential of the node SEN1 are caused to become independent of each other.

In the process of step S13, the node SEN2 is precharged. That is, the sense amplifier 17 precharges the node SEN2. Specifically, as shown in FIG. 10, the transistor 33 is in the ON state (step S12) at time t2, so that the node SEN2 is precharged to the "H" level (VHLB).

Next, the transistor 25 is turned on by precharging the node SEN2. At time t2, the sequencer 13 causes a signal STB to rise from the "L" level (VSS) to the "H" level (VDD). Therefore, the transistor 26 is turned on. Since the transistors 25 and 26 are on, the bus LBUS has the same potential as the node VLOP. That is, the bus LBUS is set to the "L" level (VSS).

In the process of step S14, the potential of the node SEN1 is clocked up. Specifically, as shown in FIG. 10, at time t2, the sequencer 13 causes the signal SPC to fall from the "H" level (VX2) to the "L" level (VSS). At time t3, the sequencer 13 causes the signal STB to fall from the "H" level (VDD) to the "L" level (VSS). Thus, the transistors 31 and 26 are turned off.

At time t3, the sequencer 13 causes a signal LPC to rise from the "L" level (VSS) to the "H" level (VX2). Thus, the transistor 30 is turned on.

Since the transistor 30 is turned on, the bus LBUS rises from the "L" level (VSS) to the "H" level (VDDLT). That is, the bus LBUS is charged. The voltage VDDLT is a voltage lower than the voltage VHLB. As a result, the capacitance element 34 is charged, and the voltage of the node SEN1 rises to a voltage Vcu1 due to capacitive coupling. The voltage Vcu1 is a voltage of the node SEN1 increased by the clock up and is higher than the voltage VHLB.

In the process of step S15, the potential of the node SEN2 is clocked up. Specifically, at time t3, the sequencer 13 causes the voltage of the node VLOP to rise from the "L" level (VSS) to the "H" level (VDDSA). The voltage VDDSA is, for example, a power supply voltage VDD.

As a result, the capacitance element 35 is charged, and the voltage of the node SEN2 rises to the voltage Vcu1 due to capacitive coupling. The voltage Vcu1 is a voltage of the node SEN2 raised by the clock up. Since the transistor 33 is on at the time, the nodes SEN1 and SEN2 are conductive and have the same potential. That is, the nodes SEN1 and SEN2 are clocked up by both the bus LBUS and the node VLOP and made to have the voltage Vcu1 eventually.

In the process of step S16, the potentials of the nodes SEN1 and SEN2 are sensed. That is, after the clock up, the sense amplifier 17 senses voltages of the nodes SEN1 and SEN2.

Specifically, as shown in FIG. 10, at time t4, the sequencer 13 causes the signal XXL to rise from the "L" level (VSS) to the "H" level (VXXL). The voltage VXXL is higher than the voltage VBLX.

In this state, when the threshold voltage of the memory cell transistor MT to be read is equal to or higher than the read voltage, the memory cell transistor MT is turned off (which will be hereinafter referred to as "off-cell"). Almost no current flows from the bit line BL coupled to the off-cell to the source line SL. Therefore, where the off-cell is read, the electric charges charged in the nodes SEN1 and SEN2 are hardly discharged. That is, at time t4, the voltages of the nodes SEN1 and SEN2 hardly change.

On the other hand, where the threshold voltage of the memory cell transistor MT to be read is less than the read voltage, the memory cell transistor MT is turned on (which will be hereinafter referred to as "on-cell"). A current flows from the bit line BL coupled to the on-cell to the source line SL. Since the voltage VXXL is higher than the voltage VBLX, the electric charges stored in the nodes SEN1 and SEN2 are discharged where the on-cell is read. That is, at time t4, the voltages of the nodes SEN1 and SEN2 begin to lower.

At time t5, the sequencer 13 causes the signal XXL to fall from the "H" level (VXXL) to the "L" level (VSS). As shown in FIG. 10, during the period from time t4 to time t5, the voltages of the nodes SEN1 and SEN2 coupled to the off-cell hardly change from the voltage Vcu1.

As shown in FIG. 10, the voltages of the nodes SEN1 and SEN2 coupled to the on-cell gradually lower from time t4 to time t5. The voltages of the nodes SEN1 and SEN2 coupled to the on-cell reach the voltage Vcu2 at time t5.

In the process of step S17, the signal S2S is caused to fall to the "L" level (VSS). Specifically, as shown in FIG. 10, at time t6, the sequencer 13 causes the signal S2S to fall from the "H" level (VX2) to the "L" level (VSS). Thus, the transistor 33 is turned off. Since the transistor 33 is turned off, the potential of the node SEN2 and the potential of the node SEN1 are made independent of each other.

Furthermore, as shown in FIG. 10, at time t6, the sequencer 13 causes the signal LPC to fall from the "H" level (VX2) to the "L" level (VSS). Thus, the transistor 30 is turned off.

Since the transistors 33 and 30 are turned off, the node SEN1 is set in the floating state. Therefore, at time t6 and thereafter, the node SEN1 takes an arbitrary value from VSS to Vcu1.

In the process of step S18, the potential of the node SEN2 is clocked down. Specifically, at time t7, the sequencer 13 causes the voltage of the node VLOP to fall from the "H" level (VDDSA) to the "L" level (VSS).

As a result, the voltage of the node SEN2 lowers due to capacitive coupling. Specifically, as shown in FIG. 10, the voltage of the node SEN2 coupled to the off-cell lowers to a voltage Vcu3. The voltage Vcu3 is the voltage of the node SEN2 lowered by the clock down (in the case of an off-cell). Assuming that the threshold voltage of the transistor 25 is Vth15, the voltage Vcu3 is from Vth15 to Vcu1.

The voltage of the node SEN2 coupled to the on-cell lowers to a voltage Vcu3'. The voltage Vcu3' is the voltage of the node SEN2 lowered by the clock down (in the case of the on-cell). The voltage Vcu3' is a voltage lower than the voltage Vcu2. The voltage Vcu3' is from VSS to Vth15. The difference between the voltages Vcu2 and Vcu3' is substantially equal to the difference between the voltages Vcu1 and Vcu3.

In the process of step S19, the sense amplifier 17 performs strobing. First, as shown in FIG. 10, at time t8, the sequencer 13 causes the signal STB to rise from the "L" level (VSS) to the "H" level (VDD). Thus, the transistor 26 is turned on. The transistor 25 coupled to the off-cell is in in the ON state based on the voltage difference between the voltage Vcu3 and the voltage Vth15. Since the transistors 25 and 26 are turned on, the voltage of the bus LBUS lowers. The voltage that the bus LBUS takes at the time is assumed to be Vlb1.

On the other hand, the transistor 25 coupled to the on-cell is turned off based on the voltage difference between the voltage Vcu3' and the voltage Vth15. Since the transistor 25 is in the OFF state, the bus LBUS is maintained substantially at the voltage VDDLT. The voltage that the bus LBUS takes at the time is assumed to be Vlb1'.

At time t9, the sequencer 13 causes the signal STB to fall from the "H" level (VDD) to the "L" level (VSS). As a result, the transistor 26 is turned off and the voltage of the bus LBUS is maintained. As a result, the logic level of read data is determined. Where the voltage of the bus LBUS is the voltage Vlb1, it is determined that the bus LBUS holds "L" level data. Where the voltage of the bus LBUS is the voltage Vlb1', it is determined that the bus LBUS holds "H" level data.

That is, where the data of the node SEN2 is at the "H" level (Vcu3), the bus LBUS is at the "L" level (Vlb1), and the "L" level data is held in the latch circuit SDL. Where the data of the node SEN2 is at the "L" level (Vcu3'), the node LBUS is kept at the "H" level (Vlb1'), and the "H" level data is held in the latch circuit SDL.

Once the logic level of the read data is determined, a logic operation is performed using the determined logic level (for example, an AND operation or an OR operation between the determined data and the data in the latch circuit ADL is performed, or an AND operation or an OR operation between the determined data and the data in the latch circuit BDL is performed). The determined logic level may be transferred to the latch circuit XDL.

In the above-mentioned flow of the read operation of the first embodiment, the steps are not limited to those of the illustrated order and can be performed in a different order from the illustrated order and/or may be performed in parallel as different steps.

<1-4> Advantages (Effects) of First Embodiment

The semiconductor memory device 1 according to the first embodiment described above is advantageous in that the circuit area of the sense amplifier 17 can be reduced. Detailed effects of the semiconductor memory device 1 according to the first embodiment will be described below.

In order to reduce the chip size of the semiconductor memory device 1, it is required to reduce the circuit area of the sense amplifier 17. To reduce the circuit area of the sense amplifier 17, the following two points are conceivable. One point is that sense nodes (corresponding to the nodes SEN1 and SEN2 in FIG. 5, for example) should use wiring capacitances and should not use capacitance elements. This is because the use of capacitance elements increases the length of the sense amplifier along the Y axis.

The other point is that the number of tracks should be reduced per sense amplifier unit SAU. If the number of tracks is increased, the size of the sense amplifier units SAU will increase along the X axis. To suppress the increase in the size of the sense amplifier units SAU along the X axis, the number of tracks should be preferably 3.5 or less.

By way of comparative example, let us consider a semiconductor memory device 1r that is according to a comparative example of the first embodiment. In order to reduce the circuit area of the sense amplifier 17, the semiconductor memory device 1r uses a wiring capacitance and is designed such that the number of tracks per sense amplifier unit SAU is 3.5. The semiconductor memory device 1r differs from the semiconductor memory device 1 according to the first embodiment mainly in that the node SEN2, the capacitance element 35 and the transistors 31 and 33 are not provided. The node SEN1 of the semiconductor memory device 1r may be hereinafter referred to as a node SENr.

In the semiconductor memory device 1r, the wiring functioning as the node SENr and the wiring functioning as the bus LBUS may be arranged adjacent to each other along the X axis, due to the reduction in the number of tracks. Where the node SENr and the bus LBUS are adjacent to each other, the node SENr may cause capacitive coupling with the bus LBUS.

If the node SENr and the bus LBUS are capacitively coupled in the semiconductor memory device 1r, a read operation cannot be performed accurately. This is because the voltage of the bus LBUS changes when the sense amplifier 17 performs strobing. Where the voltage of the bus LBUS changes, the potential of the node SENr capacitively coupled with the bus LBUS also fluctuates. If the potential of the node SENr changes, the transistor 25 coupled to the node SENr may not be accurately controlled. If the control of the transistor 25 is inaccurate, the voltage of the bus LBUS will also be inaccurate. That is, an accurate determination cannot be made as to whether the memory cell transistor MT coupled to the node SENr is an off-cell or an on-cell.

As can be seen from the above, although the number of tracks should be reduced, simply reducing the number of tracks as in the semiconductor memory device 1r may cause a problem that the read operation cannot be performed accurately. Therefore, in addition to the reduction of the number of tracks, proper measures have to be taken against the coupling between the bus LBUS and the node SENr.

Accordingly, the sense node of the semiconductor memory device 1 according to the first embodiment is designed such that the voltage change of the bus LBUS does not affect the sense node when the sense amplifier 17 performs strobing.

As described above, the semiconductor memory device 1 includes nodes SEN1 and SEN2, a capacitance element 35 and transistors 31 and 33. By turning on the transistor 33, the semiconductor memory device 1 can make the nodes SEN1 and SEN2 conductive and let them have the same potential. By turning off the transistor 33, the semiconductor memory device 1 can make the potential of the node SEN1 and the potential of the node SEN2 independent of each other.

The semiconductor memory device 1 keeps the transistor 33 in the ON state during the processes of steps S12-S16. That is, the nodes SEN1 and SEN2 are in a conductive state when the nodes SEN1 and SEN2 are sensed in a read operation of the semiconductor memory device 1. In other words, the semiconductor memory device 1 renders the nodes SEN1 and SEN2 conductive and senses both the nodes SEN1 and SEN2. By sensing both the nodes SEN1 and SEN2, the charges precharged in the nodes SEN1 and SEN2 (capacitance elements 34 and 35) are transferred to the bit line BL. Therefore, the semiconductor memory device 1 can transfer more charges as compared with the case where only one of the nodes SEN1 and SEN2 is sensed.

The semiconductor memory device 1 keeps the transistor 33 in the OFF state during the processes of steps S17-S19. That is, in a read operation of the semiconductor memory device 1, the potential of the node SEN1 and the potential of the node SEN2 are independent of each other when strobing is being performed. Specifically, the semiconductor memory device 1 makes the node SEN2 independent of the node SEN1 by turning off the transistor 33. Only the node SEN1 is capacitively coupled with the bus LBUS. Since the node SEN2 is independent of the node SEN1, the node SEN2 is not affected by changes in the voltage of the bus LBUS during the strobing.

Since SEN1 is in the floating state at time t6 and thereafter, the influence which voltage changes may have on the bus LBUS can be ignored. Since the potential of the node SEN2 is maintained without being affected, the transistor 25 coupled to the node SEN2 can also be controlled accurately. Since the transistor 25 can be controlled accurately, the voltage of the bus LBUS is also accurate. That is, an accurate determination can be made as to whether the memory cell transistor MT coupled to the nodes SEN1 and SEN2 is an off-cell or an on-cell.

In this manner, the semiconductor memory device 1 according to the first embodiment is advantageous in that a read operation can be performed normally, with the number of tracks being reduced per sense amplifier unit SAU.

<2> Modification of First Embodiment

<2-1> Configuration (Structure)

In connection with the semiconductor memory device 1 according to the first embodiment described above, an example was given where the number of tracks per sense amplifier unit SAU is 3.5. The number of tracks per sense amplifier unit SAU, however, is not limited to the structure described above. A semiconductor memory device 1 according to a modification of the first embodiment may be hereinafter referred to as a semiconductor memory device 1m.

In the semiconductor memory device 1*m* according to the modification of the first embodiment, the circuit configuration of the sense amplifier unit SAU and the timing chart of the read operation are similar to those of the semiconductor memory device 1.

FIG. 11 illustrates an example of a cross-sectional structure of a circuit region included in the semiconductor memory device 1*m* according to the modification of the first embodiment. FIG. 11 illustrates a similar region to that shown in FIG. 7.

As shown in FIG. 11, in the semiconductor memory device 1*m* according to the modification, the number of tracks per sense amplifier unit SAU may be three. A specific structure will be described below.

In the semiconductor memory device 1*m*, a semiconductor substrate 38, an insulating layer 39, a first diffusion region NP1, a second diffusion region NP2, a third diffusion region NP3 and a conductive layer 70 have structures and functions similar to those of the semiconductor memory device 1 according to the first embodiment.

The insulating layer 39 includes, for example, conductive layers 40*m*-45*m*, 50*m*-55*m*, 60*m*-64*m* and 70 and contacts CS1-CS3 and C1-C3. Each of the conductive layers 40*m*-45*m*, 50*m*-55*m*, 60*m*-64*m* and 70 and each of the contacts CS1-CS3 and C1-C3 contains such a metal as tungsten, for example.

The contact CS1 is provided on the first diffusion region NP1. The first diffusion region NP1 and the contact CS1 are electrically coupled to each other. The conductive layer 42*m* is provided on the contact CS1. The contact C1 is provided on the conductive layer 42*m*. The conductive layer 52*m* is provided on the contact C1. The contact C2 is provided on the conductive layer 52*m*. The conductive layer 62*m* is provided on the contact C2. The contact C3 is provided on the conductive layer 62*m*. The conductive layer 70 is provided on the contact C3.

In a wiring layer D0, the conductive layers 40*m* to 45*m* are arranged in order from the −X side to the +X side. In a wiring layer D1, the conductive layers 50*m*-55*m* are arranged in order from the −X side to the +X side. The conductive layers 50*m*-55*m* are located above the conductive layers 40*m*-45*m*, respectively, as viewed along the Z axis. In a wiring layer D2, the conductive layers 60*m* to 64*m* are arranged in order from the −X side to the +X side.

The conductive layers 40*m* to 45*m*, 50*m* to 55*m* and 60*m* to 64*m* extend, for example, along the Y axis.

The contact CS2 is provided on a second diffusion region NP2 (not shown). The second diffusion region NP2 and the contact CS2 are electrically coupled to each other. The contact CS2 is provided in a layer including the contact CS1. The contact CS2 is coupled to, for example, the conductive layer 41*m* located in the wiring layer D0. In the wiring layer D0, the contact CS2 may be coupled to a wiring other than the conductive layer 41*m*.

The contact CS3 is provided on a third diffusion region NP3 (not shown). The third diffusion region NP3 and the contact CS3 are electrically coupled to each other. The contact CS3 is provided in a layer including the contact CS1. The contact CS3 is coupled to, for example, the conductive layer 44*m* located in the wiring layer D0. In the wiring layer D0, the contact CS3 may be coupled to a wiring other than the conductive layer 44*m*.

The conductive layers 50*m* and 53*m* function, for example, as the node SENT. The conductive layers 51*m* and 54*m* function, for example, as the bus LBUS. The conductive layers 60*m* and 64*m* function, for example, as the bit lines BL. The conductive layers 42*m*, 52*m* and 62*m* coupled to the conductive layer 70 function as the power supply line. That is, the conductive layers 42*m*, 52*m* and 62*m* and the contacts CS1 and C1-C3 jointly function as the power supply line.

The conductive layer 50*m* functioning as the node SEN1 and the conductive layer 51*m* functioning as the bus LBUS are arranged adjacent to each other, so that an inter-wiring capacitance is generated between them. The inter-wiring capacitance between the conductive layer 50*m* and the conductive layer 51*m* corresponds to the capacitance element 34 (see FIG. 5).

Similarly, the conductive layer 53*m* functioning as the node SEN1 and the conductive layer 54*m* functioning as the bus LBUS are arranged adjacent to each other, so that an inter-wiring capacitance is generated between them. The inter-wiring capacitance between the conductive layer 53*m* and the conductive layer 54*m* corresponds to the capacitance element 34.

The conductive layers 42*m*, 52*m* and 62*m* and the set of contacts CS1 and C1-C3 are shared as the power supply for the transistors Tr1 and Tr2. Thus, in the semiconductor memory device 1*m* as well as in the semiconductor memory device 1, for example, the transistors Tr1 and Tr2 can share the power supply in the sense amplifier units SAU adjacent along the X axis.

Thus, in the semiconductor memory device 1*m* according to the modification of the first embodiment, six wirings (conductive layers) arranged along the X axis are shared by two sense amplifier units SAU. In other words, the SAU pitch is substantially equal to the width of three wirings arranged along the X axis. That is, in the semiconductor memory device 1*m* according to the modification of the first embodiment, the number of tracks per sense amplifier unit SAU is three.

Similar to FIG. 11, FIG. 12 illustrates an example of the cross-sectional structure of the circuit region included in the semiconductor memory device 1*m* according to the modification of the first embodiment. Similar to the relationship between the node SENT and the bus LBUS, the conductive layer functioning as the node SEN2 and the conductive layer functioning as the node VLOP are arranged adjacent to each other.

As shown in FIG. 12, the insulating layer 39 of the semiconductor memory device 1*m* further includes conductive layers 80*m*-83*m*. The conductive layers 80*m*-83*m* are located in the wiring layer D0 or D1. The conductive layers 80*m* and 81*m* are located on the −X side of the set of contacts CS1 and C1-C3. The conductive layer 80*m* and the conductive layer 81*m* are adjacent to each other along the X axis.

The conductive layers 82*m* and 83*m* are located on the +X side of the set of contacts CS1 and C1-C3. The conductive layer 82*m* and the conductive layer 83*m* are adjacent to each other along the X axis.

The conductive layers 80*m* and 82*m* function as the node SEN2. The conductive layers 81*m* and 83*m* function as the node VLOP.

The conductive layer 80*m* functioning as the node SEN2 and the conductive layer 81*m* functioning as the node VLOP are arranged adjacent to each other, so that an inter-wiring capacitance is generated between them. The inter-wiring capacitance between the conductive layer 80*m* and the conductive layer 81*m* corresponds to the capacitance element 35 (see FIG. 5).

Similarly, the conductive layer 82*m* functioning as the node SEN2 and the conductive layer 83*m* functioning as the node VLOP are arranged adjacent to each other, so that an inter-wiring capacitance is generated between them. The inter-wiring capacitance between the conductive layer 82*m* and the conductive layer 83*m* corresponds to the capacitance element 35.

<2-2> Advantages (Effects) of Semiconductor Memory Device 1*m*

Similar to the semiconductor memory device 1, the semiconductor memory device 1*m* according to the modification of the first embodiment described above is advantageous in that a read operation can be performed normally, with the number of tracks being reduced per sense amplifier unit SAU.

Furthermore, the semiconductor memory device 1*m* is advantageous in that the circuit area of the sense amplifier 17 can be further reduced. In the semiconductor memory device 1*m*, the number of tracks per sense amplifier unit SAU can be further reduced. Since the number of tracks can be reduced, the semiconductor memory device 1*m* can have a structure in which the width of the sense amplifier unit SAU along the X axis is reduced. Since the width of the sense amplifier unit SAU along the X axis is reduced, the semiconductor memory device 1*m* is advantageous in that the circuit area of the sense amplifier 17 can be further reduced.

<3> Second Embodiment

The semiconductor memory device 1 according to the second embodiment will be described below. The semiconductor memory device 1 according to the second embodiment is different from the semiconductor memory device 1 according to the first embodiment. In the descriptions below, the semiconductor memory device 1 of the second embodiment may be referred to as a semiconductor memory device 1*b* to distinguish it from the semiconductor memory device 1 of the first embodiment.

<3-1> Configuration (Structure)

<3-1-1> Circuit Configuration of Sense Amplifier Unit SAU

The semiconductor memory device 1*b* according to the second embodiment differs from the semiconductor memory device 1 according to the first embodiment mainly with respect to a signal for clocking up the voltage of the node SEN2. The signal that clocks up the voltage of the node SEN2 in the semiconductor memory device 1*b* is a clock supplied to a node CLKSA. In the other points, the second embodiment is similar to the first embodiment. The descriptions below will therefore refer mainly to the points in which the semiconductor memory device 1*b* according to the second embodiment differs from the semiconductor memory device according to the first embodiment.

The points different from the first embodiment will be described with reference to FIGS. 13-15. FIG. 13 is a circuit diagram of the sense amplifier unit SAU included in the semiconductor memory device 1*b* according to the second embodiment. In FIG. 13, the region corresponding to that shown in FIG. 5 of the first embodiment is extracted and shown.

As shown in FIG. 13, the semiconductor memory device 1*b* according to the second embodiment differs from the semiconductor memory device 1 according to the first embodiment in that the second electrode of the capacitance element 35 is coupled to the node CLKSA. Since FIG. 13 is similar to FIG. 5 in the other points, a detailed description will be omitted.

In the semiconductor memory device 1*b*, one electrode of the capacitance element 35 is coupled to the node SEN2, and the other electrode of the capacitance element 35 is coupled to the node CLKSA. A clock is applied to the node CLKSA. The clock is applied to clock up the voltage of the node SEN2.

<3-2> Structure of Wirings

FIG. 14 illustrates an example of the cross-sectional structure of a circuit region included in the semiconductor memory device 1*b* according to the second embodiment. FIG. 14 illustrates the same region as FIG. 8. In the semiconductor memory device 1*b*, a conductive layer functioning as the node SEN2 and a conductive layer functioning as the node CLKSA are arranged adjacent to each other.

As shown in FIG. 14, the insulating layer 39 of the semiconductor memory device 1*b* further includes conductive layers 80*b*-83*b*. The conductive layers 80*b*-83*b* are located in the wiring layer D0 or D1. The conductive layers 80*b* and 81*b* are located on the −X side of the set of contacts CS1 and C1-C3. The conductive layer 80*b* and the conductive layer 81*b* are adjacent to each other along the X axis.

The conductive layers 82*b* and 83*b* are located on the +X side of the set of contacts CS1 and C1-C3. The conductive layer 82*b* and the conductive layer 83*b* are adjacent to each other along the X axis.

The conductive layers 80*b* and 82*b* function as the node SEN2. The conductive layers 81*b* and 83*b* function as the node CLKSA.

The conductive layer 80*b* functioning as the node SEN2 and the conductive layer 81*b* functioning as the node CLKSA are arranged adjacent to each other, so that an inter-wiring capacitance is generated between them. The inter-wiring capacitance between the conductive layer 80*b* and the conductive layer 81*b* corresponds to the capacitance element 35 (see FIG. 13).

Similarly, the conductive layer 82*b* functioning as the node SEN2 and the conductive layer 83*b* functioning as the node CLKSA are arranged adjacent to each other, so that an inter-wiring capacitance is generated between them. The inter-wiring capacitance between the conductive layer 82*b* and the conductive layer 83*b* corresponds to the capacitance element 35.

Since the relationship between the node SENT and the bus LBUS in the semiconductor memory device 1*b* is similar to that in the semiconductor memory device 1, a description thereof will be omitted.

<3-3> Read Operation

Figure 15:
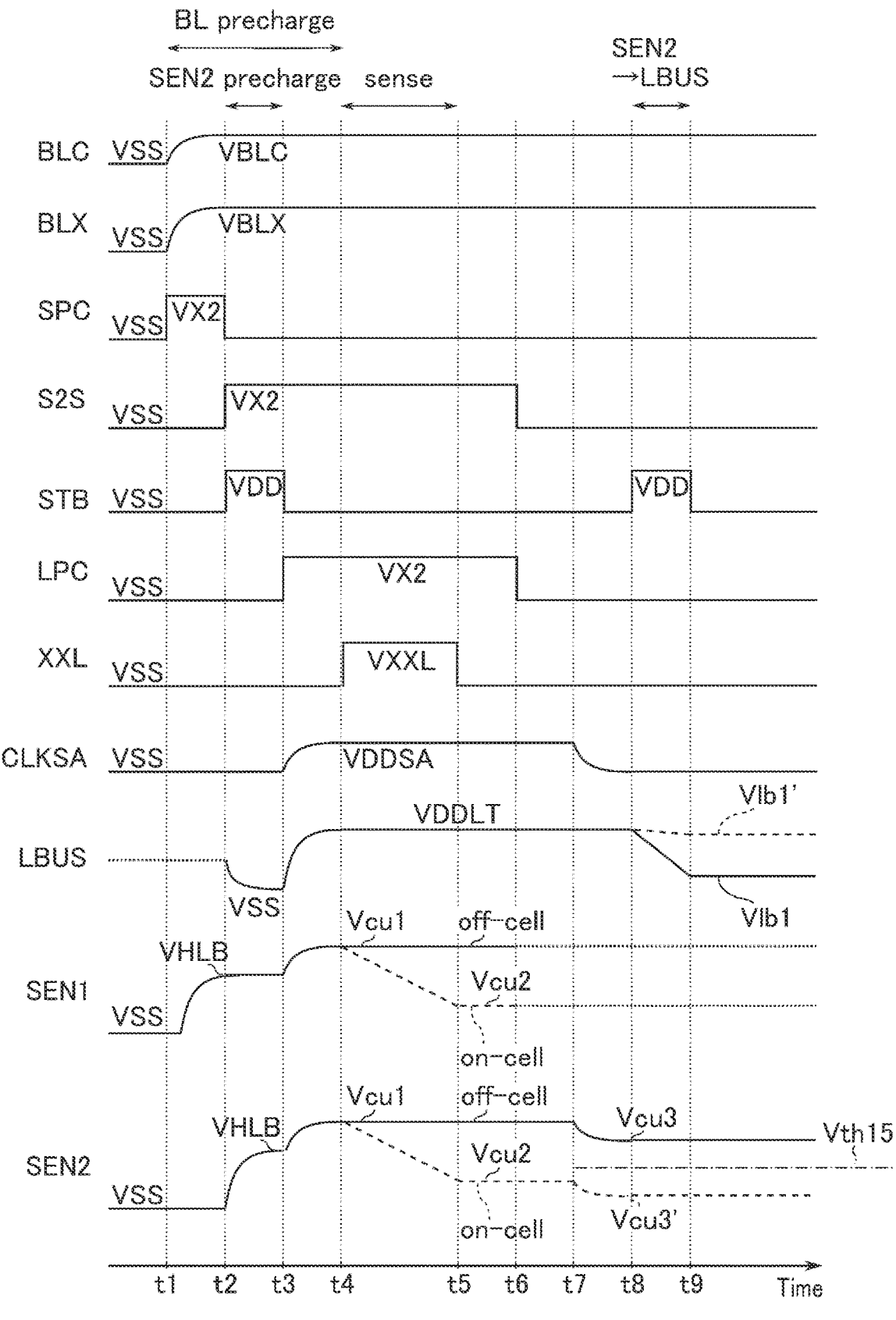
FIG. 15 illustrates a timing chart, which is an example of voltages of various signals that are applied during a read operation of the semiconductor memory device 1b according to the second embodiment.

FIG. 15 is a timing chart illustrating voltages of various signals that are applied during a read operation of the semiconductor memory device 1*b*. As shown in FIG. 15, the timing chart of the voltage of the node CLKSA is similar to the timing chart of the voltage of the node VLOP of the semiconductor memory device 1.

Specifically, at time t1, the sequencer 13 sets the voltage of the node CLKSA to the "L" level (VSS).

At time t3, the sequencer 13 causes the voltage of the node CLKSA to rise from the "L" level (VSS) to the "H" level (VDDSA). As a result, the capacitance element 35 is charged, and the voltage of the node SEN2 rises to a voltage Vcu1, due to capacitive coupling.

At time t7, the sequencer 13 causes the voltage of the node CLKSA to lower from the "H" level (VDDSA) to the "L" level (VSS). As a result, the voltage of the node SEN2 lowers due to capacitive coupling. Specifically, as shown in FIG. 15, the voltage of the node SEN2 coupled to the off-cell lowers to the voltage Vcu3. Also, the voltage of the node SEN2 coupled to the on-cell lowers to the voltage Vcu3'.

In the semiconductor memory device 1*b*, a ground voltage VSS, for example, is applied to the node VLOP. Other signals are similar to those shown in the timing chart (see FIG. 7) of the first embodiment, so that a description thereof will be omitted.

<3-4> Advantages (Effects) of Second Embodiment

Similar to the semiconductor memory device 1, the semiconductor memory device 1*b* according to the second embodiment described above is advantageous in that the circuit area of the sense amplifier 17 can be reduced.

In connection with the semiconductor memory device 1 according to the first embodiment, an example was given where the voltage VLOP is used to clock up the voltage of the node SEN2. However, what clocks up the voltage of the node SEN2 is not limited to the voltage VLOP. As in the semiconductor memory device 1*b* according to the second embodiment, the clock supplied to the node CLKSA may be used to clock up the voltage of the node SEN2.

The semiconductor memory device 1*b* according to the second embodiment is advantageous in that the number of tracks can be reduced and yet measures can be taken against the coupling between the bus LBUS and the node SEN1, as in the first embodiment. That is, similar to the semiconductor memory device 1, the semiconductor memory device 1*b* is advantageous in that a read operation can be performed normally, with the number of tracks being reduced per sense amplifier unit SAU.

Since the number of tracks can be reduced, the semiconductor memory device 1*b* can have a structure in which the width of the sense amplifier unit SAU along the X axis is reduced. Since the width of the sense amplifier unit SAU along the X axis is reduced, the semiconductor memory device 1*b* is advantageous in that the circuit area of the sense amplifier 17 can be reduced.

<4> Modification of Embodiments

In connection with the semiconductor memory devices 1 according to the first and second embodiments described above, an example was given where the voltage of the node SEN1 is clocked up by the bus LBUS. However, what clocks up the voltage of the node SEN1 is not limited to the bus LBUS. For example, the bus DBUS may be used to clock up the voltage of the node SEN1.

Where this configuration is adopted, the conductive layer functioning as the node SEN1 and the conductive layer functioning as the bus DBUS are arranged adjacent to each other. In this case, an inter-wiring capacitance is generated between the conductive layer functioning as the node SENT and the conductive layer functioning as the bus DBUS. This inter-wiring capacitance corresponds to the capacitance element 34 (see FIG. 4 or FIG. 13).

<5> Other Modifications, Etc

In the first and second embodiments, the semiconductor memory devices 1 and 1*b* may have structures different from those mentioned above. The structures described in connection with the modifications of the first and second embodiments are applicable to the first and second embodiments either in part or in a combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell transistor;
a first bit line electrically coupled to the first memory cell transistor;
a first sense amplifier electrically coupled to the first bit line; and
a first latch circuit electrically coupled to the first sense amplifier,
wherein
the first sense amplifier includes:
a first node coupled to the first bit line;
a first transistor including one end electrically coupled to the first latch circuit;
a second node coupled to a gate of the first transistor;
a second transistor coupled between the first node and the second node,
a first conductor functioning as the first node; and
a second conductor coupled to the first latch circuit, being adjacent to the first conductor and functioning as a first wiring,
the second transistor is in an ON state during an operation of transferring a charge from the first bit line to the first node and the second node in accordance with data of the first memory cell transistor,
the second transistor is in an OFF state during an operation of transferring data of the second node to the first latch circuit, and
the second conductor has a first inter-wiring capacitance between the second conductor and the first conductor.

2. The semiconductor memory device according to claim 1, wherein
the first sense amplifier further includes:
a third conductor functioning as the second node; and
a fourth conductor coupled to one end of the second transistor, being adjacent to the third conductor and functioning as a second wiring, and
the fourth conductor has a second inter-wiring capacitance between the fourth conductor and the third conductor.

3. The semiconductor memory device according to claim 1, wherein
the first sense amplifier further includes:
a third conductor functioning as the second node;
a fourth conductor coupled to one end of the second transistor and functioning as a second wiring; and
a fifth conductor adjacent to the third conductor and functioning as a third wiring that receives a clock signal, and
the fifth conductor has a second inter-wiring capacitance between the fifth conductor and the third conductor.

4. The semiconductor memory device according to claim 1, further comprising:
a second sense amplifier adjacent to the first sense amplifier in a first direction,
wherein
the first sense amplifier and the second sense amplifier arranged in the first direction include seven wirings arranged in the first direction.

5. The semiconductor memory device according to claim 4, wherein at least one of the seven wirings is electrically coupled to the first latch circuit.

6. The semiconductor memory device according to claim 1, wherein a width of the first sense amplifier in a first direction corresponds to a width of 3.5 wirings arranged in the first direction.

7. The semiconductor memory device according to claim 6, further comprising:

a second sense amplifier adjacent to the first sense amplifier in the first direction, wherein a width of the second sense amplifier in the first direction corresponds to a width of 3.5 wirings arranged in the first direction.

8. The semiconductor memory device according to claim 1, further comprising:

a second sense amplifier adjacent to the first sense amplifier in a first direction, wherein the first sense amplifier and the second sense amplifier arranged in the first direction include six wirings arranged in the first direction.

9. The semiconductor memory device according to claim 1, wherein a width of the first sense amplifier in a first direction corresponds to a width of 3 wirings arranged in the first direction.

10. The semiconductor memory device according to claim 9, further comprising:

a second sense amplifier adjacent to the first sense amplifier in the first direction, wherein a width of the second sense amplifier in the first direction corresponds to a width of 3 wirings arranged in the first direction.

11. The semiconductor memory device according to claim 1, further comprising:

a second sense amplifier adjacent to the first sense amplifier in a first direction;

a second latch circuit electrically coupled to the second sense amplifier;

a second bit line electrically coupled to the second sense amplifier; and a second memory cell transistor electrically coupled to the second bit line, wherein the second sense amplifier includes:

a third node coupled to the second bit line;

a sixth transistor including one end electrically coupled to the second latch circuit;

a fourth node coupled to a gate of the sixth transistor; and a seventh transistor coupled between the third node and the fourth node, the seventh transistor is in an ON state during an operation of transferring a charge from the second bit line to the third node and the fourth node in accordance with data of the second memory cell transistor, and the seventh transistor is in an OFF state during an operation of transferring data of the fourth node to the second latch circuit.

12. The semiconductor memory device according to claim 1, wherein the first sense amplifier further includes:

a first capacitance including one end coupled to the first node and another end coupled to a first wiring;

a second capacitance including one end coupled to the second node and another end coupled to a third wiring; and a third transistor including one end coupled to the first node and another end coupled to a first power supply.

13. A semiconductor memory device comprising:

a first memory cell transistor;

a first bit line electrically coupled to the first memory cell transistor;

a first sense amplifier electrically coupled to the first bit line; and a first latch circuit electrically coupled to the first sense amplifier, wherein the first sense amplifier includes:

a first node coupled to the first bit line;

a first transistor including one end electrically coupled to the first latch circuit;

a second node coupled to a gate of the first transistor;

a second transistor coupled between the first node and the second node, a first capacitance including one end coupled to the first node and another end coupled to a first wiring; and a second capacitance including one end coupled to the second node and another end coupled to a second wiring, the second transistor is in an ON state during an operation of transferring a charge from the first bit line to the first node and the second node in accordance with data of the first memory cell transistor, and the second transistor is in an OFF state during an operation of transferring data of the second node to the first latch circuit.

14. The semiconductor memory device according to claim 13, wherein the first sense amplifier further includes a third transistor including one end coupled to the first node and another end coupled to a first power supply.

15. A semiconductor memory device comprising:

a first memory cell transistor;

a first bit line electrically coupled to the first memory cell transistor;

a first sense amplifier electrically coupled to the first bit line;

a first latch circuit electrically coupled to the first sense amplifier; and a second sense amplifier adjacent to the first sense amplifier in a first direction, wherein the first sense amplifier includes:

a first node coupled to the first bit line;

a first transistor including one end electrically coupled to the first latch circuit;

a second node coupled to a gate of the first transistor;

a second transistor coupled between the first node and the second node, the second transistor is in an ON state during an operation of transferring a charge from the first bit line to the first node and the second node in accordance with data of the first memory cell transistor, the second transistor is in an OFF state during an operation of transferring data of the second node to the first latch circuit, the first sense amplifier further includes a fourth transistor, the second sense amplifier includes a fifth transistor, and the semiconductor memory device includes a source/drain region shared by the fourth transistor and the fifth transistor.

* * * * *